(12) United States Patent
Chen et al.

(10) Patent No.: US 9,614,529 B1
(45) Date of Patent: Apr. 4, 2017

(54) INPUT/OUTPUT (I/O) DRIVER IMPLEMENTING DYNAMIC GATE BIASING OF BUFFER TRANSISTORS

(71) Applicant: QUALCOMM Incorporated, San Diego, CA (US)

(72) Inventors: Wilson Chen, San Diego, CA (US); Chiew-Guan Tan, San Diego, CA (US); Reza Jalilizeinali, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/012,696

(22) Filed: Feb. 1, 2016

(51) Int. Cl.
*H03K 3/00* (2006.01)
*H03K 19/0185* (2006.01)

(52) U.S. Cl.
CPC .......................... *H03K 19/018507* (2013.01)

(58) Field of Classification Search
CPC ............................................. H03K 19/018507
USPC ......................................................... 327/108
See application file for complete search history.

(56) References Cited

U.S. PATENT DOCUMENTS

| | | | |
|---|---|---|---|
| 5,097,149 A * | 3/1992 | Lee | H03K 19/09429 326/27 |
| 5,825,640 A | 10/1998 | Quigley et al. | |
| 5,973,534 A | 10/1999 | Singh | |
| 6,316,977 B1 | 11/2001 | Sargeant | |
| 7,471,102 B2 | 12/2008 | Maheshwari et al. | |
| 7,511,531 B2 | 3/2009 | Pan et al. | |
| 7,839,174 B2 | 11/2010 | Wang et al. | |
| 7,915,933 B2 | 3/2011 | Vlasenko et al. | |
| 7,936,209 B2 | 5/2011 | Bhattacharya et al. | |
| 8,159,261 B2 | 4/2012 | Kim et al. | |
| 8,159,262 B1 | 4/2012 | Bhattacharya et al. | |
| 8,212,590 B2 | 7/2012 | Wang et al. | |
| 8,754,677 B2 | 6/2014 | Chen et al. | |
| 2002/0089382 A1 | 7/2002 | Yang | |
| 2010/0226189 A1 | 9/2010 | Choi | |
| 2011/0316505 A1 | 12/2011 | Shrivastava | |
| 2012/0169381 A1 | 7/2012 | Mei | |
| 2012/0326768 A1 | 12/2012 | Bhattacharya et al. | |

* cited by examiner

*Primary Examiner* — Kenneth B Wells
(74) *Attorney, Agent, or Firm* — Loza & Loza LLP

(57) ABSTRACT

An input/output (I/O) driver that includes circuitry for over-voltage protection of first and second FETs coupled in series between a first rail and an output, and third and fourth FETs coupled between the output and a second rail. The circuitry is configured to generate a gate bias voltage for the second FET that transitions from high to low bias voltages state when the output voltage ($V_{PAD}$) begins transitioning from low to high logic voltages, and transitions back to the high bias voltage while $V_{PAD}$ continues to transition towards the high logic voltage. Further, the circuitry is configured to generate a gate bias voltage for the third FET that transitions from low to high bias voltages when $V_{PAD}$ begins transitioning from high to low logic voltages, and transitions back to the low bias voltage while $V_{PAD}$ continues to transition towards the low logic voltage.

30 Claims, 10 Drawing Sheets

INPUT/OUTPUT (I/O) DRIVER IMPLEMENTING DYNAMIC GATE BIASING OF BUFFER TRANSISTORS

BACKGROUND

Field

Aspects of the present disclosure relate generally to input/output (I/O) drivers, and more particularly, to an I/O driver that implements dynamic gate biasing of buffer transistors for implementing the I/O driver using low-voltage transistors.

Background

An input/output (I/O) driver receives an input voltage that varies between a high logic voltage and a low logic voltage associated with a particular core voltage domain. In response to the input voltage, the I/O driver generates an output voltage that varies between a high logic voltage and a low logic voltage associated with an I/O voltage domain.

Generally, a difference between the high and low logic voltage of the I/O voltage domain is greater than a difference between the high and low logic voltage of the core voltage domain. This may be because the core circuitry of an integrated circuit (IC) operates with smaller voltages for higher processing speed and lower power consumption purposes.

When a voltage signal processed by the core circuitry is ready to be transmitted to another IC, the core circuitry provides the voltage signal as an input voltage to an I/O driver. As discussed above, the I/O driver generates an output voltage based on the input voltage, wherein the output voltage is in a higher voltage domain suitable for transmission of the signal to another IC or external device.

Generally, I/O drivers are implemented with field effect transistors (FETs) that are much larger than FETs implemented in core circuitry. This is because the FETs of I/O drivers need to be able to withstand the larger voltages associated with the I/O voltage domain. As a result, different masks and processes are needed to manufacture IC with relatively small FETs for the core circuitry and relatively large FETs for the I/O drivers. This produces higher costs and delays associated with the manufacture of such ICs.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a pull-up circuit including a first transistor and a second transistor coupled in series between a first voltage rail and an output, and a pull-down circuit including a third transistor and a fourth transistor coupled in series between the output and a second voltage rail.

The apparatus further includes a first voltage generator configured to generate a first bias voltage for a control input of the second transistor, the first bias voltage configured to transition from a first relatively high voltage to a first relatively low voltage approximately when a voltage at the output begins transitioning from a first low logic voltage towards a first high logic voltage due to the pull-up circuit coupling the first voltage rail to the output and the pull-down circuit decoupling the output from the second voltage rail, and the first bias voltage also configured to transition from the first relatively low voltage to the first relatively high voltage while the output voltage continues to transition from the first low logic voltage towards the first high logic voltage.

Additionally, the apparatus includes a second voltage generator configured to generate a second bias voltage for a control input of the third transistor, the second bias voltage configured to transition from a second relatively low voltage to a second relatively high voltage approximately when the output voltage begins transitioning from the first high logic voltage towards the first low logic voltage due to the pull-down circuit coupling the output to the second voltage rail and the pull-up circuit decoupling the first voltage rail from the output, and the second bias voltage also configured to transition from the second relatively high voltage to the second relatively low voltage while the output voltage continues to transition from the first high logic voltage towards the first low logic voltage.

Another aspect of the disclosure relates to a method including coupling a first voltage rail to an output by turning on a first transistor and a second transistor coupled in series between the first voltage rail and the output in response to an input voltage transitioning from a first low logic voltage to a first high logic voltage; and decoupling a second voltage rail from the output by turning off a third transistor and a fourth transistor coupled in series between the output and the second voltage rail in response to the input voltage transitioning from the first low logic voltage to the first high logic voltage, wherein a voltage at the output transitions from a second low logic voltage towards a second high logic voltage in response to the coupling of the first voltage rail to the output and the decoupling of the second voltage rail from the output.

The method further includes coupling the second voltage rail to the output by turning on the third transistor and the fourth transistor in response to the input signal transitioning from the first high logic voltage to the first low logic voltage; and decoupling the first voltage rail from the output by turning off the first transistor and the second transistor in response to the input signal transitioning from the first high logic voltage to the low logic voltage, wherein the output voltage transitions from the second high logic voltage towards the second low logic voltage in response to the coupling of the second voltage rail to the output and the decoupling of the first voltage rail from the output.

Additionally, the method includes transitioning a first bias voltage applied to a control input of the second transistor from a first relatively high voltage to a first relatively low voltage approximately when the output voltage begins transitioning from the second low logic voltage towards the second high logic voltage; transitioning a first bias voltage applied to a control input of the second transistor from a first relatively high voltage to a first relatively low voltage approximately when the output voltage begins transitioning from the second low logic voltage towards the second high logic voltage; transitioning a second bias voltage applied to a control input of the third transistor from a second relatively low voltage to a second relatively high voltage approximately when the output voltage begins transitioning from the second high logic voltage towards the low logic voltage; and transitioning the second bias voltage from the second relatively high voltage to the second relatively low voltage while the output voltage continues to transition from the second high logic voltage towards the second low logic voltage.

Another aspect of the disclosure relates to an apparatus including means for coupling a first voltage rail to an output by turning on a first transistor and a second transistor coupled in series between the first voltage rail and the output in response to an input voltage transitioning from a first low logic voltage to a first high logic voltage; and means for decoupling a second voltage rail from the output by turning off a third transistor and a fourth transistor coupled in series between the output and the second voltage rail in response to the input voltage transitioning from the first low logic voltage to the first high logic voltage, wherein a voltage at the output transitions from a second low logic voltage towards a second high logic voltage in response to the coupling of the first voltage rail to the output and the decoupling of the second voltage rail from the output.

The apparatus further includes means for coupling the second voltage rail to the output by turning on the third transistor and the fourth transistor in response to the input signal transitioning from the first high logic voltage to the first low logic voltage; and means for decoupling the first voltage rail from the output by turning off the first transistor and the second transistor in response to the input signal transitioning from the first high logic voltage to the first low logic voltage, wherein the output voltage transitions from the second high logic voltage towards the second low logic voltage in response to the coupling of the second voltage rail to the output and the decoupling of the first voltage rail from the output.

Additionally, the apparatus includes means for transitioning a first bias voltage applied to a control input of the second transistor from a first relatively high voltage to a first relatively low voltage approximately when the output voltage begins transitioning from the second low logic voltage towards the second high logic voltage; means for transitioning the first bias voltage from the first relatively low voltage to the first relatively high voltage while the output voltage continues to transition from the second low logic voltage towards the second high logic voltage; means for transitioning a second bias voltage applied to a control input of the third transistor from a second relatively low voltage to a second relatively high voltage approximately when the output voltage begins transitioning from the second high logic voltage to the second low logic voltage; and means for transitioning the second bias voltage from the second relatively high voltage to the second relatively low voltage while the output voltage continues to transition from the second high logic voltage towards the second low logic voltage.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
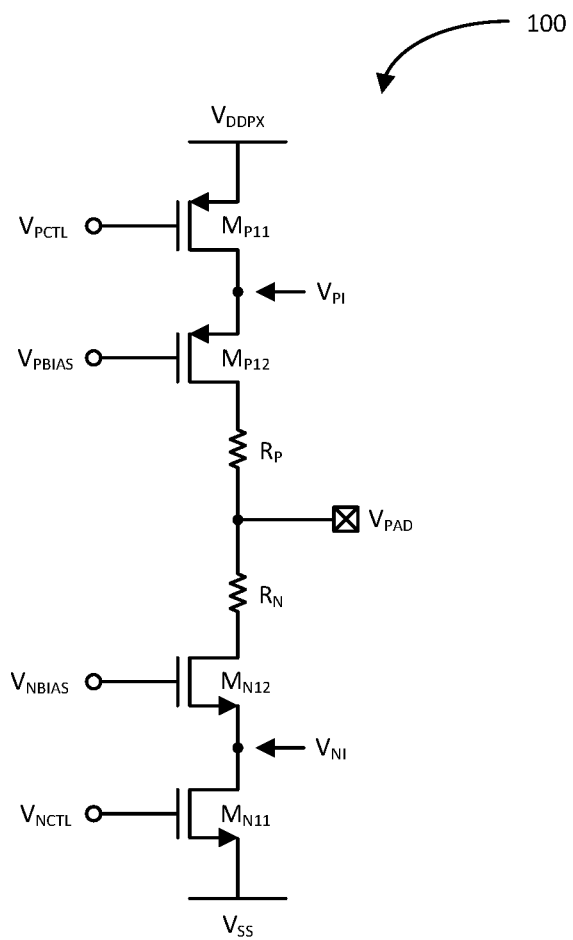
FIG. 1A illustrates a schematic diagram of an exemplary input/output (I/O) driver in accordance with an aspect of the disclosure.

FIG. 1A illustrates a schematic diagram of an exemplary input/output (I/O) driver 100 in accordance with an aspect of the disclosure. The I/O driver 100 is configured to receive an input voltage $V_{IN}$ from, for example, a core circuit of an integrated circuit (IC). The input voltage $V_{IN}$ may swing between a high logic voltage and a low logic voltage according to a first or core voltage domain.

In response to the high and low voltages of the input voltage $V_{IN}$, the I/O driver 100 generates an output voltage $V_{PAD}$ that swings between a high logic voltage and a low logic voltage according to a second or I/O voltage domain, respectively. As discussed in more detail below, the high and low logic voltages of the I/O voltage domain may swing substantially between $V_{DDPX}$ (applied to a first voltage rail) and $V_{SS}$ (applied to a second voltage rail). The I/O driver 100 provides the output voltage $V_{PAD}$ to a load coupled between the output and the second voltage rail ($V_{SS}$). The load may have a capacitance $C_{LOAD}$.

In this example, the I/O driver 100 includes a pull-up circuit situated between a first voltage rail ($V_{DDPX}$) and an output ($V_{PAD}$). The pull-up circuit is configured to couple the first voltage rail to the output to cause the output voltage $V_{PAD}$ at the output of the I/O device 100 to transition to and settle at a high logic voltage, such as substantially the voltage $V_{DDPX}$ at the first rail voltage (e.g., 3.6V).

The pull-up circuit is also configured to isolate or decouple the first voltage rail from the output of the I/O device 100 to allow the output voltage $V_{PAD}$ to transition to and settle at a low logic voltage, such as substantially a voltage $V_{SS}$ at a second rail voltage (e.g., 0V or ground). In this example, the pull-up circuit includes a pair of p-channel complementary metal oxide semiconductor (CMOS) field effect transistors (FETs) (hereinafter "PMOS") $M_{P11}$ and $M_{P12}$, and resistor $R_P$. The PMOS $M_{P11}$ is responsive to a control signal $V_{PCTL}$ for turning on and off the PMOS $M_{P11}$ in order to pull-up and isolate the output voltage $V_{PAD}$ to and from the first rail voltage $V_{DDPX}$, respectively.

The PMOS $M_{P12}$ of the pull-up circuit may be biased with a substantially constant gate voltage $V_{PBIAS}$, which may be set to $V_{DDPX}/2$ (e.g., 1.8V). Configured as such, the PMOS $M_{P12}$ turns on and off in response to the turning on and off of PMOS $M_{P11}$, respectively. For instance, when control voltage $V_{PCTL}$ is substantially at a low logic voltage, such as $V_{DDPX}/2$ (e.g., 1.8V), the PMOS $M_{P11}$ is turned on because its gate-to-source voltage ($V_{GS}$) (e.g., 3.6V−1.8V=1.8V) is greater than the threshold voltage $V_T$ (e.g., 0.4V) of the device. The turning on of PMOS $M_{P11}$ causes $V_{DDPX}$ to be substantially applied to the source of PMOS $M_{P12}$. Accordingly, PMOS $M_{P12}$ turns on because its $V_{GS}$ (e.g., 3.6V−1.8V=1.8V) is greater than its threshold voltage $V_T$ (e.g., 0.4V). Both PMOS $M_{P11}$ and $M_{P12}$ being turned on causes $V_{DDPX}$ to be applied substantially to the output of the I/O driver 100 by way of resistor $R_P$, which causes the output voltage $V_{PAD}$ to transition to and settle substantially at $V_{DDPX}$ (e.g., ~3.6V). The resistor $R_P$ limits the current flow through the FETs $M_{P11}$ and $M_{P12}$ to prevent overstressing or damaging of these devices.

Similarly, when control voltage $V_{PCTL}$ is at a high logic voltage, such as substantially at $V_{DDPX}$ (e.g., +3.6V), the PMOS $M_{P11}$ is turned off because its $V_{GS}$ (e.g., 3.6V−3.6V=0V) is less than its threshold voltage $V_T$ (e.g., 0.4V). The PMOS $M_{P11}$ being turned off isolates $V_{DDPX}$ from the source of PMOS $M_{P12}$, which causes the voltage at the source of PMOS $M_{P12}$ to decrease and settle at a voltage $V_{PI}$ no greater than a threshold voltage above $V_{PBIAS}$ (e.g., <2.2V). Thus, PMOS $M_{P12}$ is turned off because its $V_{GS}$ does not exceed its threshold voltage $V_T$. With both PMOS $M_{P11}$ and $M_{P12}$ turned off, the output of the I/O driver 100 is substantially isolated from $V_{DDPX}$, allowing a pull-down circuit of the I/O driver 100 to pull-down the output voltage $V_{PAD}$ so that it transitions to and settles at substantially $V_{SS}$ (e.g., 0V).

When the output voltage $V_{PAD}$ is substantially at $V_{SS}$, the PMOS $M_{P12}$ prevents the entire voltage difference between $V_{DDPX}$ and $V_{SS}$ to be applied across PMOS $M_{P11}$, thereby preventing overstressing or damage to device $M_{P11}$. Instead, the voltage difference ($V_{DDPX}$−$V_{SS}$) is split, albeit unequally, across both PMOS $M_{P11}$ and $M_{P12}$. Thus, PMOS $M_{P12}$ acts as a buffering device for PMOS $M_{P11}$.

The I/O driver 100 further includes a pull-down circuit situated between the output of the I/O driver 100 and the second voltage rail ($V_{SS}$). The pull-down circuit is configured to couple the output to the second voltage rail to cause the output voltage $V_{PAD}$ to transition to and settle at a low logic voltage, such as substantially the steady-state second rail voltage $V_{SS}$ (e.g., ground). The pull-down circuit is also configured to isolate or decouple the output of the I/O device 100 from the second voltage rail to allow the output voltage $V_{PAD}$ to transition to and settle at a high logic voltage, such as substantially the first rail voltage $V_{DDPX}$. In this example, the pull-down circuit includes a pair of n-channel CMOS devices (hereinafter "NMOS") $M_{N11}$ and $M_{N12}$, and resistor $R_N$. The NMOS $M_{N11}$ is responsive to a control signal $V_{NCTL}$ for turning on and off the NMOS $M_{N11}$ in order to couple and isolate the output to and from the second voltage rail, respectively.

The NMOS $M_{N12}$ of the pull-down circuit may be biased with a substantially constant gate voltage $V_{NBIAS}$, which may be set to $V_{DPPX}/2$ (e.g., 1.8V). Configured as such, the NMOS $M_{N12}$ turns on and off in response to the turning on and off of NMOS $M_{N11}$, respectively. For instance, when control voltage $V_{NCTL}$ is at a high logic voltage, such as $V_{DPPX}/2$ (e.g., 1.8V), the NMOS $M_{N11}$ is turned on because its $V_{GS}$ (e.g., 1.8V−0V=1.8V) is greater than its threshold voltage $V_T$ (e.g., 0.4V). The turning on of NMOS $M_{N11}$ causes $V_{SS}$ to be substantially applied to the source of NMOS $M_{N12}$. In response, NMOS $M_{N12}$ turns on because its $V_{GS}$ (e.g., 1.8V−0V=1.8V) is greater than its threshold voltage $V_T$ (e.g., 0.4V). Both NMOS $M_{N11}$ and $M_{N12}$ being turned on causes $V_{SS}$ to be applied substantially to the output of the I/O driver 100 by way of resistor $R_N$, which results in the output voltage $V_{PAD}$ to transition to and settle substantially at the second rail voltage $V_{SS}$ (e.g., 0V). The resistor $R_N$ limits the current flow through the devices $M_{N11}$ and $M_{N12}$ to prevent overstressing or damaging of the devices.

Similarly, when control voltage $V_{NCTL}$ is at a low logic voltage, such as $V_{SS}$ (e.g., 0V), the NMOS $M_{N11}$ is turned off because its $V_{GS}$ (e.g., 0V−0V=0V) is less than its threshold voltage $V_T$ (e.g., 0.4V). The device NMOS $M_{N11}$ being turned off isolates $V_{SS}$ from the source of NMOS $M_{N12}$, which causes the source of NMOS $M_{N12}$ to decrease and settle to no more than a threshold voltage below $V_{NBIAS}$ (e.g., >1.4V). Accordingly, NMOS $M_{N12}$ is turned off because its $V_{GS}$ does not exceed its threshold voltage $V_T$. Both NMOS $M_{N11}$ and $M_{N12}$ being turned off decouple the output from the second voltage rail, thereby allowing the pull-up circuit to cause the output voltage $V_{PAD}$ to transition to and settle at the high logic voltage, such as substantially at the first rail voltage $V_{DDPX}$ (e.g., +3.6V).

When the output voltage $V_{PAD}$ is at $V_{DDPX}$, the NMOS $M_{N12}$ prevents the entire voltage difference between $V_{DDPX}$ and $V_{SS}$ to be applied across NMOS $M_{N11}$, thereby preventing overstressing or damage to device $M_{N11}$. Instead, the voltage difference ($V_{DDPX}$−$V_{SS}$) is split, albeit unequally, across both NMOS $M_{P12}$ and $M_{N11}$. Thus, NMOS $M_{N12}$ acts as a buffering device for NMOS $M_{N11}$.

Note that the respective logic voltages pertaining to the output voltage $V_{PAD}$, the control $V_{PCTL}$ voltage, and the $V_{NCTL}$ gate voltage are in different voltage domains. For instance, the high and low logic voltages pertaining to the $V_{PAD}$ voltage domain vary between substantially $V_{DDPX}$ (e.g., 3.6V) and $V_{SS}$ (e.g., 0V). The high and low logic voltages pertaining to the $V_{PCTL}$ voltage domain vary between substantially $V_{DDPX}$ (e.g., 3.6V) and $V_{DDIX}$ (e.g., 1.8V). And, the high and low logic voltages pertaining to the $V_{NCTL}$ voltage domain vary between substantially $V_{DDIX}$ (e.g., 1.8V) and $V_{SS}$ (e.g., 0V).

Figure 1B:
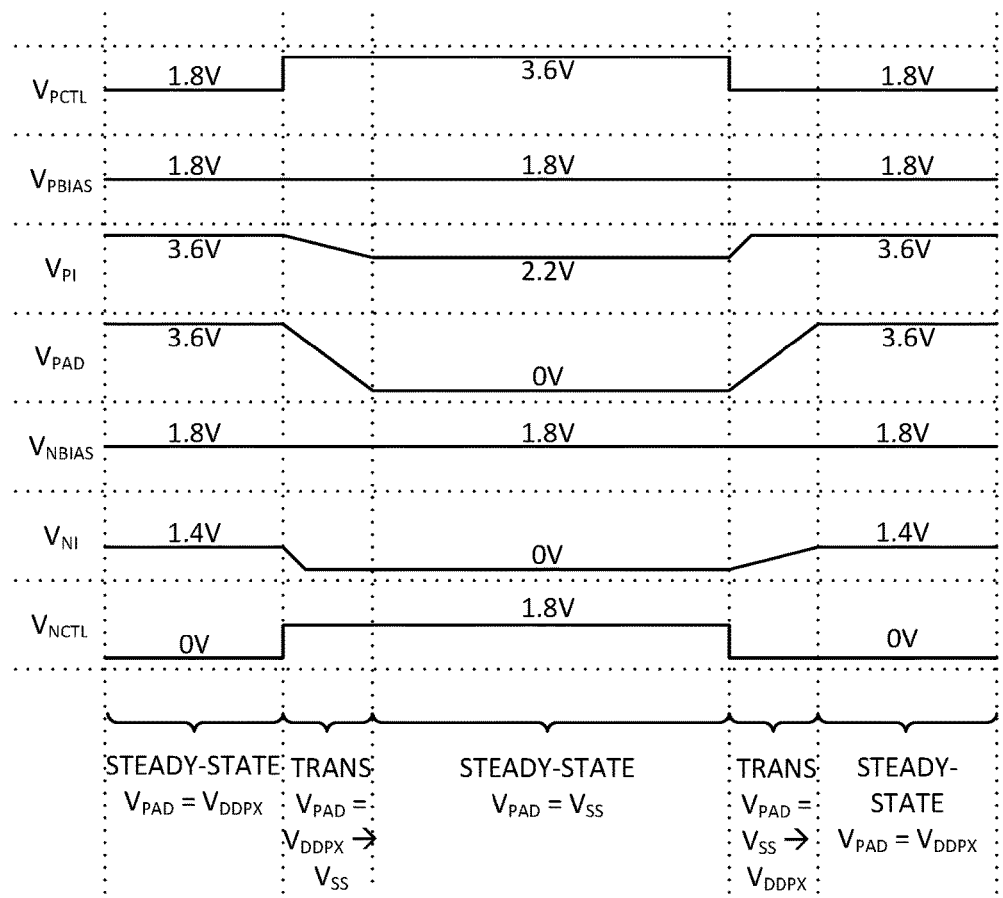
FIG. 1B illustrates a timing diagram of exemplary signals relevant to the operation of the I/O driver of FIG. 1A in accordance with another aspect of the disclosure.

FIG. 1B illustrates a timing diagram of exemplary signals relevant to the operation of the exemplary I/O driver 100 in accordance with another aspect of the disclosure. The x- or horizontal axis of the timing diagram represents time, and is divided into four states or time intervals: (1) when the output voltage $V_{PAD}$ of the I/O driver 100 is at a steady-state high logic voltage $V_{DDPX}$, which is indicated in the left-most and right-most columns of the timing diagram; (2) when the output voltage $V_{PAD}$ is transitioning from the high logic voltage $V_{DDPX}$ to a low logic voltage $V_{SS}$, which is indicated in the second column from the left; (3) when the output voltage $V_{PAD}$ is at a steady-state low logic voltage $V_{SS}$, which is indicated in the third column from the left; and (4) when the output voltage $V_{PAD}$ is transitioning from the low logic voltage $V_{SS}$ to the high logic voltage $V_{DDPX}$, which is indicated in the fourth column from the left.

The y- or vertical axis of the timing diagram represents the various voltages of the I/O driver 100. For instance, from top to bottom, the voltages are: (1) the control voltage $V_{PCTL}$ for PMOS $M_{P11}$; (2) the gate bias voltage $V_{PBIAS}$ for PMOS $M_{P12}$; (3) the voltage $V_{PI}$ at the source of PMOS $M_{P12}$; (4) the output voltage $V_{PAD}$ of the I/O driver 100; (5) the gate bias voltage $V_{NBIAS}$ for NMOS $M_{N12}$; (6) the voltage $V_{NI}$ at the source of NMOS $M_{N12}$; and (7) the control voltage $V_{NCTL}$ for NMOS $M_{N11}$.

In operation, during the state or time interval where the output voltage $V_{PAD}$ of the I/O driver 100 is at a steady-state high logic voltage $V_{DDPX}$ as indicated in the left-most column of the timing diagram, the control voltage $V_{PCTL}$ is at a low logic voltage $V_{DDIX}$ (e.g., 1.8V) and the gate bias voltage $V_{PBIAS}$ is at a constant $V_{DDPX}/2$ voltage (e.g., 1.8V) in order to turn on both PMOS $M_{P11}$ and $M_{P12}$, respectively. The turning on of both PMOS $M_{P11}$ and $M_{P12}$ results in substantially applying $V_{DDPX}$ to the output of the I/O driver 100, thereby causing the output voltage $V_{PAD}$ to be at the high logic voltage $V_{DDPX}$ (e.g., 3.6V). Also, the voltage $V_{PI}$ at the source of PMOS $M_{P12}$ is substantially at $V_{DDPX}$ (e.g., 3.6V). Further, during this state or time interval, the control voltage $V_{NCTL}$ is at a low logic voltage $V_{SS}$ (e.g., 0V) to turn off NMOS $M_{N11}$. The gate bias voltage $V_{NBIAS}$ for NMOS $M_{N12}$ is at the constant $V_{DDPX}/2$ voltage (e.g., 1.8V). With NMOS $M_{N11}$ being turned off, the voltage $V_{NI}$ at the source of NMOS $M_{N12}$ settles to no more than a threshold voltage below $V_{NBIAS}$, for example, to $V_{NBIAS}-V_T$ (e.g., 1.4V). Thus, both NMOS $M_{N11}$ and $M_{N12}$ are turned off to isolate or decouple the output of the I/O driver 100 from $V_{SS}$.

During the state or time interval where the output voltage $V_{PAD}$ of the I/O driver 100 is transitioning from the high logic voltage $V_{DDPX}$ to the low logic voltage $V_{SS}$ as indicated in the second column from the left, the control voltage $V_{PCTL}$ for PMOS $M_{P11}$ is raised to the high logic voltage $V_{DDPX}$ (e.g., 3.6V) to turn off PMOS $M_{P11}$. The gate bias voltage $V_{PBIAS}$ of PMOS $M_{P12}$ remains at the constant $V_{DDPX}/2$ (e.g., 1.8V). Thus, the voltage $V_{PI}$ at the source of PMOS $M_{P12}$ decreases and settles to no more than a threshold voltage above $V_{PBIAS}$, for example, to $V_{PBIAS}+V_T$ (e.g., 2.2V). Thus, both PMOS $M_{P11}$ and $M_{P12}$ are turned off to isolate or decouple the output of the I/O driver 100 from $V_{DDPX}$. Also, during this state or time interval, the control voltage $V_{NCTL}$ is raised to a high logic voltage $V_{DDIX}$ (e.g., 1.8V) to turn on NMOS $M_{N11}$. The turning on of NMOS $M_{N11}$ causes the voltage $V_{NI}$ at the source of NMOS $M_{N12}$ to decrease to substantially $V_{SS}$ (e.g., 0V). The gate bias voltage of NMOS $M_{N12}$ remains at $V_{DDPX}/2$ (e.g., 1.8V). Thus, the gate-to-source voltage $V_{GS}$ of NMOS $M_{N12}$ is greater than its threshold voltage $V_T$, thereby causing NMOS $M_{N12}$ to turn on. Both NMOS $M_{N11}$ and $M_{N12}$ being turned on cause the output voltage $V_{PAD}$ to transition to and settle substantially at $V_{SS}$ (e.g., 0V).

Once the voltages have transitioned, they will remain substantially constant during the state or time interval where the output voltage $V_{PAD}$ is at substantially $V_{SS}$, as indicated in the third column from the left. That is, the voltage $V_{PCTL}$ is at the high logic voltage $V_{DDPX}$ and $V_{NBIAS}$ is at $V_{DDPX}/2$ to keep devices $M_{P11}$ and $M_{P12}$ turned off to isolate or decouple the output from the first voltage rail ($V_{DDPX}$). The voltage $V_{PI}$ at the source of PMOS $M_{P12}$ remains substantially constant at no more than a threshold voltage $V_T$ above $V_{NBIAS}$ (e.g., 2.2V). The voltage $V_{NCTL}$ is at the high logic voltage $V_{DDIX}$ and voltage $V_{NBIAS}$ is at the constant $V_{DDPX}/2$ to keep both devices $M_{N11}$ and $M_{N12}$ turned on to cause the output voltage $V_{PAD}$ to be at the low logic voltage $V_{SS}$. Both devices $M_{N11}$ and $M_{N12}$ being turned on cause the voltage $V_{NI}$ at the source of NMOS $M_{N12}$ to be at $V_{SS}$ (e.g., 0V).

During the state or time interval where the output voltage $V_{PAD}$ of the I/O driver 100 is transitioning from the low logic voltage $V_{SS}$ to the high logic voltage $V_{DDPX}$ as indicated in the fourth column from the left, the control voltage $V_{PCTL}$ for PMOS $M_{P11}$ is lowered to the low logic voltage $V_{DDIX}$ (e.g., 1.8V) to turn on PMOS $M_{P11}$. The gate bias voltage $V_{PBIAS}$ for PMOS $M_{P12}$ remains at the constant $V_{DDPX}/2$ (e.g., 1.8V). Thus, both PMOS $M_{P11}$ and $M_{P12}$ turn on. Accordingly, the voltage $V_{PI}$ at the source of PMOS $M_{P12}$ as well as the output voltage $V_{PAD}$ transition to the high logic voltage $V_{DDPX}$ (e.g., 3.6 V). Also, during this state or time interval, the control voltage $V_{NCTL}$ is lowered to the low logic voltage $V_{SS}$ (e.g., 0V) to turn off NMOS $M_{N11}$. The gate bias voltage $V_{NBIAS}$ of NMOS $M_{N12}$ remains at the constant $V_{DPPX}/2$ (e.g., 1.8V). Accordingly, the voltage $V_{NI}$ at the source of NMOS $M_{N12}$ increases to at least a threshold voltage below $V_{NBIAS}$, to, for example, 1.4V. Thus, the gate-to-source voltage $V_{GS}$ of NMOS $M_{N12}$ does not exceed its threshold voltage $V_T$, thereby causing NMOS $M_{N12}$ to turn off. Both NMOS $M_{N11}$ and $M_{N12}$ being turned off isolate or decouple the output voltage $V_{PAD}$ from $V_{SS}$ (e.g., 0V). Once the voltages have transitioned, they will remain substantially constant during the state or time interval where the output voltage $V_{PAD}$ is at the high logic voltage $V_{DDPX}$, as indicated in the right-most column.

There are a couple of issues with the I/O driver 100. For instance, if the devices $M_{P11}$, $M_{P12}$, $M_{N11}$, and $M_{N12}$ used in I/O driver 100 are manufactured in accordance with 45 nm, 40 nm or 28 nm technology (e.g., to use the same technology for all other non-I/O devices (e.g., core devices) in an integrated circuit), the maximum reliability voltage across any terminals ($V_{GS}$, $V_{GD}$, and $V_{DS}$) of these devices is about 2.0V. If the devices are exposed to voltages above the reliable limit of 2.0V and for an extended period of time (e.g., a few picoseconds or more), recoverable or unrecoverable damage to these devices may result. Such damage may be due to negative bias temperature instability (NBTI) or hot carrier injection (HCI). As a consequence, the performance and functionality of the devices may degrade or completely fail.

With reference again to FIG. 1B, when the output voltage $V_{PAD}$ is at the high logic voltage $V_{DDPX}$ as indicated in the left-most and right-most columns of the timing diagram, the voltage at the drain of NMOS $M_{N12}$ is substantially at $V_{DDPX}$ (e.g., 3.6V) and the voltage at the source of NMOS $M_{N12}$ is at 1.4V. Thus, the voltage difference (e.g., $V_{DS}$) across the drain and source of NMOS $M_{N12}$ is 2.2V. As previously discussed, this voltage differential of 2.2V across NMOS $M_{N12}$ exceeds the reliability limit of +2.0V if this device is manufactured in accordance with a particular implementation.

Further, during the state or time interval where the output voltage $V_{PAD}$ is transitioning from $V_{DDPX}$ to $V_{SS}$ as indicated in the second column from the left, the voltage $V_{NI}$ at the source of NMOS $M_{N12}$ decreases from 1.4V to 0V at a rate much faster than the output voltage $V_{PAD}$ decreases from 3.6V to 0V, due to generally a larger load present at the output of the I/O driver 100. As a result, the voltage difference $V_{DS}$ across the drain and source of NMOS $M_{N12}$ increases up to about 2.8V during the transition of the output voltage $V_{PAD}$ from $V_{DDPX}$ to $V_{SS}$, again exceeding the reliability limit of 2.0V if the device is manufactured in accordance with a particular implementation.

Similarly, when the output voltage $V_{PAD}$ is at the low logic voltage $V_{SS}$ as indicated in the third column from the left, the voltage at the drain of the PMOS $M_{P12}$ is substantially at $V_{SS}$ (e.g., 0V) and the voltage at the source of the PMOS $M_{P12}$ is at 2.2V. Thus, the voltage difference (e.g., $V_{DS}$) across the drain and source of PMOS $M_{P12}$ is 2.2V. As previously discussed, this voltage differential of 2.2V across PMOS $M_{P12}$ exceeds the reliability limit of 2.0V if this device is manufactured in accordance with a particular implementation.

Also, similarly, during the state or time interval where the output voltage $V_{PAD}$ is transitioning from $V_{SS}$ to $V_{DDPX}$ as indicated in the fourth column from the left, the voltage $V_{PI}$ at the source of PMOS $M_{P12}$ increases from 2.2V to 3.6V at a rate much faster than the output voltage $V_{PAD}$ increases from 0V to 3.6V due to generally a larger load present at the output of the I/O driver 100. As a result, the voltage differential $V_{DS}$ across the drain and source of PMOS $M_{P12}$ increases up to about 2.8V during the transition of the output voltage $V_{PAD}$ from $V_{SS}$ to $V_{DDPX}$, again exceeding the reliability limit of 2.0V if the device is manufactured in accordance with a particular implementation.

Figure 1C:
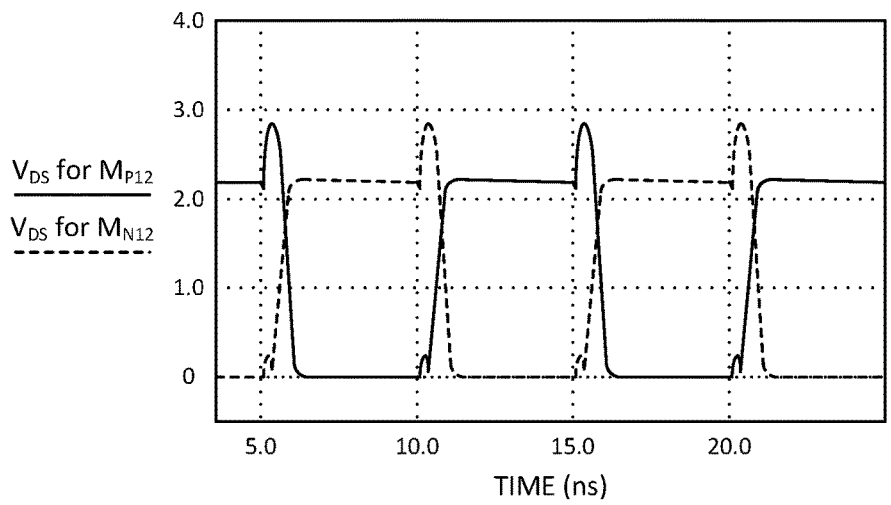
FIG. 1C illustrates a graph of exemplary drain-to-source voltages ($V_{DS}$) across respective buffer devices used in the I/O driver of FIG. 1A in accordance with another aspect of the disclosure.

FIG. 1C illustrates a graph of exemplary voltages ($V_{DS}$) across respective devices $M_{P12}$ and $M_{N12}$ used in the exemplary I/O driver 100 in accordance with another aspect of the disclosure. When the output voltage $V_{PAD}$ is substantially at steady-state $V_{DDPX}$ (e.g., 3.6V), which occurs in this graph between 6 nanoseconds (ns) and 10 ns, the voltage difference ($V_{DS}$) across the drain and source of NMOS $M_{N12}$ is approximately at 2.2V, which exceeds the reliability limit of 2.0V for a 45 nm, 40 nm or 28 nm technology device. Also, during the transition of the output voltage $V_{PAD}$ from $V_{DDPX}$ to $V_{SS}$ (e.g., from 3.6V to 0V), which occurs in this graph between 10 ns and 11 ns, the voltage difference ($V_{DS}$) across the drain and source of NMOS $M_{N12}$ spikes up to approximately 2.8V, which substantially exceeds the reliability limit of 2.0V for a device manufactured with a particular implementation.

Similarly, when the output voltage $V_{PAD}$ is substantially at steady-state $V_{SS}$ (e.g., 0V), which occurs in this graph between 11 ns and 15 ns, the voltage difference ($V_{DS}$) across the drain and source of PMOS $M_{P12}$ is approximately at 2.2V, which exceeds the reliability limit of 2.0V for a 45 nm, 40 nm or 28 nm technology device. Also, during the transition of the output voltage $V_{PAD}$ from $V_{SS}$ to $V_{DDPX}$, which occurs in this graph between 15 ns and 16 ns, the voltage difference ($V_{DS}$) across the drain and source of PMOS $M_{P12}$ spikes up to approximately 2.8V, which substantially exceeds the reliability limit of 2.0V for a device manufactured with a particular implementation.

Thus, there is a need to implement lower voltage devices, such as those manufactured in accordance with 45 nm, 40 nm or 28 nm technology, for I/O driver operations, while controlling the voltages across the devices so as to not exceed their reliability limits. A discussion of an exemplary I/O driver that achieves at least this end is provided below.

Figure 2A:
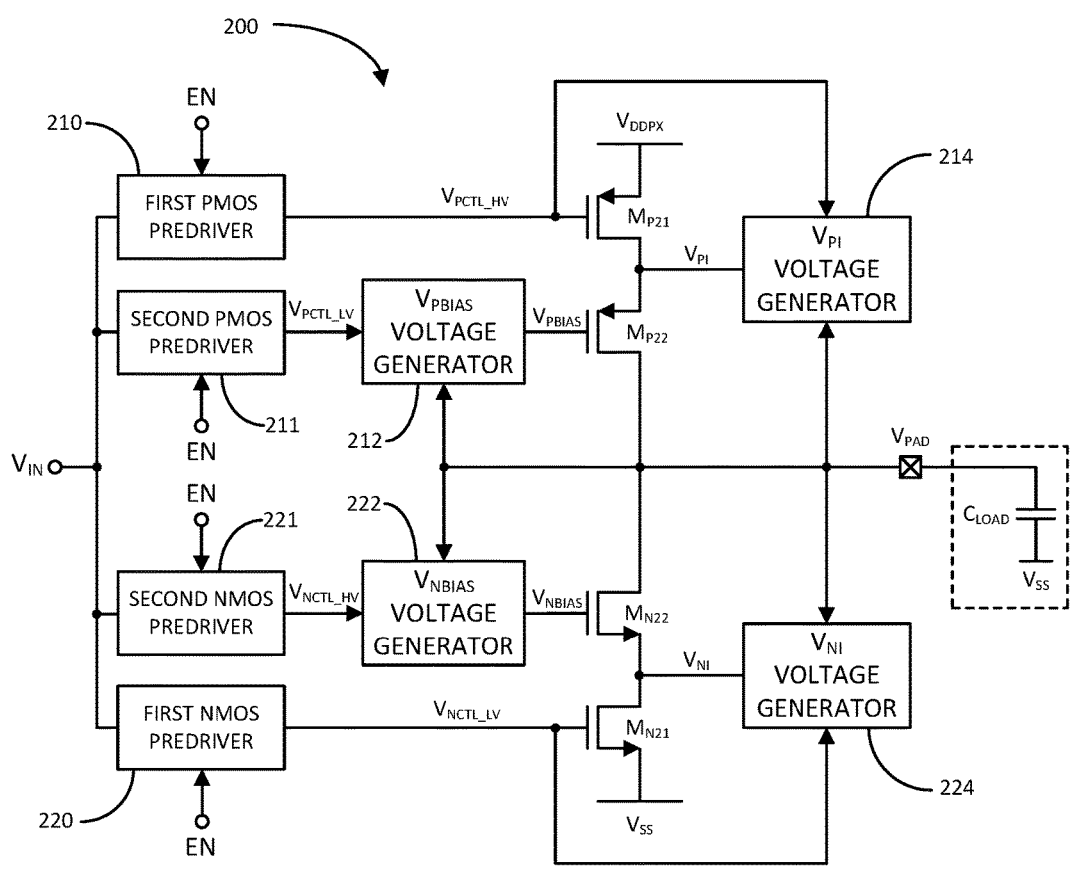
FIG. 2A illustrates a schematic diagram of another exemplary input/output (I/O) driver in accordance with another aspect of the disclosure.

FIG. 2A illustrates a schematic diagram of an input/output (I/O) driver 200 in accordance with another aspect of the disclosure. One of the differences between I/O driver 200 and I/O driver 100 is that the bias voltages $V_{NBIAS}$ and $V_{PBIAS}$ are not constant, but change during transitions of the output voltage $V_{PAD}$ from high-to-low logic voltages and from low-to-high logic voltages, respectively. This is done to reduce the maximum voltages across the buffer devices $M_{N22}$ and $M_{P22}$ to below their reliability limits during transitions of the output voltage $V_{PAD}$, respectively. Additionally, the I/O driver 200 applies bias voltages to the sources of $M_{N22}$ and $M_{P22}$ to prevent over-voltage of such devices when the output voltage $V_{PAD}$ is at steady-state high and low logic voltages, respectively.

As an overview, the I/O driver 200 is configured to receive an input voltage $V_{IN}$ from, for example, a core circuit of an IC. The input voltage $V_{IN}$ may swing between high and low logic voltages according to a first (e.g., core) voltage domain. In response to the high and low voltages of the input voltage $V_{IN}$, the I/O driver 200 generates an output voltage $V_{PAD}$ that swings between high and low logic voltages according to a second (e.g., "I/O") voltage domain, respectively. The high and low logic voltages of the second voltage domain may coincide substantially with $V_{DDPX}$ and $V_{SS}$. The I/O driver 200 provides the output voltage $V_{PAD}$ to a load having a capacitance $C_{LOAD}$.

More specifically, the I/O driver 200 includes a pull-up circuit having PMOS $M_{P21}$ and $M_{P22}$ coupled in series between a first voltage rail ($V_{DDPX}$) and the output ($V_{PAD}$) of the I/O driver. Similarly, the I/O driver 200 includes a pull-down circuit including NMOS $M_{N22}$ and $M_{N21}$ coupled in series between the output ($V_{PAD}$) and a second voltage rail ($V_{SS}$).

The I/O driver 200 further includes a first PMOS predriver 210 configured to generate a voltage signal $V_{PCTL\_HV}$ in response to an input signal $V_{IN}$. The voltage domain for $V_{PCTL\_HV}$ varies between a low logic voltage $V_{DDIX}$ (e.g., $V_{DDPX}/2$) and a high logic voltage $V_{DDPX}$. The I/O driver 200 further includes a second PMOS predriver 211 configured to generate a voltage signal $V_{PCTL\_LV}$ in response to an input signal $V_{IN}$. The voltage domain for $V_{PCTL\_LV}$ varies between a low logic voltage $V_{SS}$ and a high logic voltage $V_{DDIX}$. Thus, when the input voltage $V_{IN}$ is low, $V_{PCTL\_HV}$ is at $V_{DDPX}$ and $V_{PCTL\_LV}$ is at $V_{DDIX}$. When the input voltage $V_{IN}$ is high, $V_{PCTL\_HV}$ is at $V_{DDIX}$ and $V_{PCTL\_LV}$ is at $V_{SS}$.

Similarly, the I/O driver 200 further includes a first NMOS predriver 220 configured to generate a voltage signal $V_{NCTL\_LV}$ in response to the input signal $V_{IN}$. The voltage domain for $V_{NCTL\_LV}$ varies between a low logic voltage $V_{SS}$ and a high logic voltage $V_{DDIX}$. The I/O driver 200 further includes a second NMOS predriver 221 configured to generate a voltage signal $V_{NCTL\_HV}$ in response to the input signal $V_{IN}$. The voltage domain for $V_{NCTL\_HV}$ varies between a low logic voltage $V_{DDIX}$ and a high logic voltage $V_{DDPX}$. Thus, when the input voltage $V_{IN}$ is low, $V_{NCTL\_LV}$ is at $V_{DDIX}$ and $V_{NCTL\_HV}$ is at $V_{DDPX}$. When the input voltage $V_{IN}$ is high, $V_{NCTL\_LV}$ is at $V_{SS}$ and $V_{NCTL\_HV}$ is at $V_{DDIX}$.

The signal $V_{PCTL\_HV}$ generated by the first PMOS predriver 210 is applied to the gate of PMOS $M_{P21}$ and to a $V_{PI}$ voltage generator 214. The signal $V_{PCTL\_LV}$ generated by the second PMOS predriver 211 is applied to a $V_{PBIAS}$ voltage generator 212. Similarly, the signal $V_{NCTL\_LV}$ generated by the first NMOS driver 220 is applied to the gate of NMOS $M_{N21}$ and to a $V_{NI}$ voltage generator 224. The signal $V_{NCTL\_HV}$ generated by the second NMOS predriver 221 is applied to a $V_{NBIAS}$ voltage generator 222.

The $V_{PBIAS}$ voltage generator 212 is configured to generate a bias voltage $V_{PBIAS}$ based on $V_{PCTL\_LV}$ and $V_{PAD}$. The bias voltage $V_{PBIAS}$ is applied to the gate of PMOS $M_{P22}$. Similarly, the $V_{NBIAS}$ voltage generator 222 is configured to generate a bias voltage $V_{NBIAS}$ based on $V_{NCTL\_HV}$ and $V_{PAD}$. The bias voltage $V_{NBIAS}$ is applied to the gate of NMOS $M_{N22}$.

The $V_{PI}$ voltage generator 214 is configured to generate a defined voltage $V_{PI}$ based on $V_{PCTL\_HV}$ and $V_{PAD}$. The defined voltage $V_{PI}$ is applied to the source of PMOS $M_{P22}$. The defined voltage $V_{PI}$ protects the PMOS $M_{P22}$ from over-voltage when the output voltage $V_{PAD}$ is at a steady-state low logic voltage. For example, when the output voltage $V_{PAD}$ is at the steady-state low logic voltage $V_{SS}$ (e.g., 0V), the defined voltage $V_{PI}$ is substantially at $V_{DDIX}$ (e.g., 1.8V). Due to the defined voltage $V_{PI}$, the drain-to-source voltage $V_{DS}$ of PMOS $M_{P22}$ is, for example, 1.8V, below a reliability maximum voltage of 2.0V for certain device technology.

Similarly, the $V_{NI}$ voltage generator 224 is configured to generate a defined voltage $V_{NI}$ based on $V_{NCTL\_LV}$ and $V_{PAD}$. The defined voltage $V_{NI}$ is applied to the source of NMOS $M_{N22}$. The defined voltage $V_{NI}$ protects the NMOS $M_{N22}$ from over-voltage when the output voltage $V_{PAD}$ is at a steady-state high logic voltage. For example, when the output voltage $V_{PAD}$ is at the steady-state high logic voltage $V_{DDPX}$ (e.g., 3.6V), the defined voltage $V_{NI}$ is substantially at $V_{DDIX}$ (e.g., 1.8V). Due to the defined voltage $V_{NI}$, the drain-to-source voltage $V_{DS}$ of NMOS $M_{N22}$ is, for example, 1.8V, below a reliability maximum voltage of 2.0V for certain device technology.

Figure 2B:
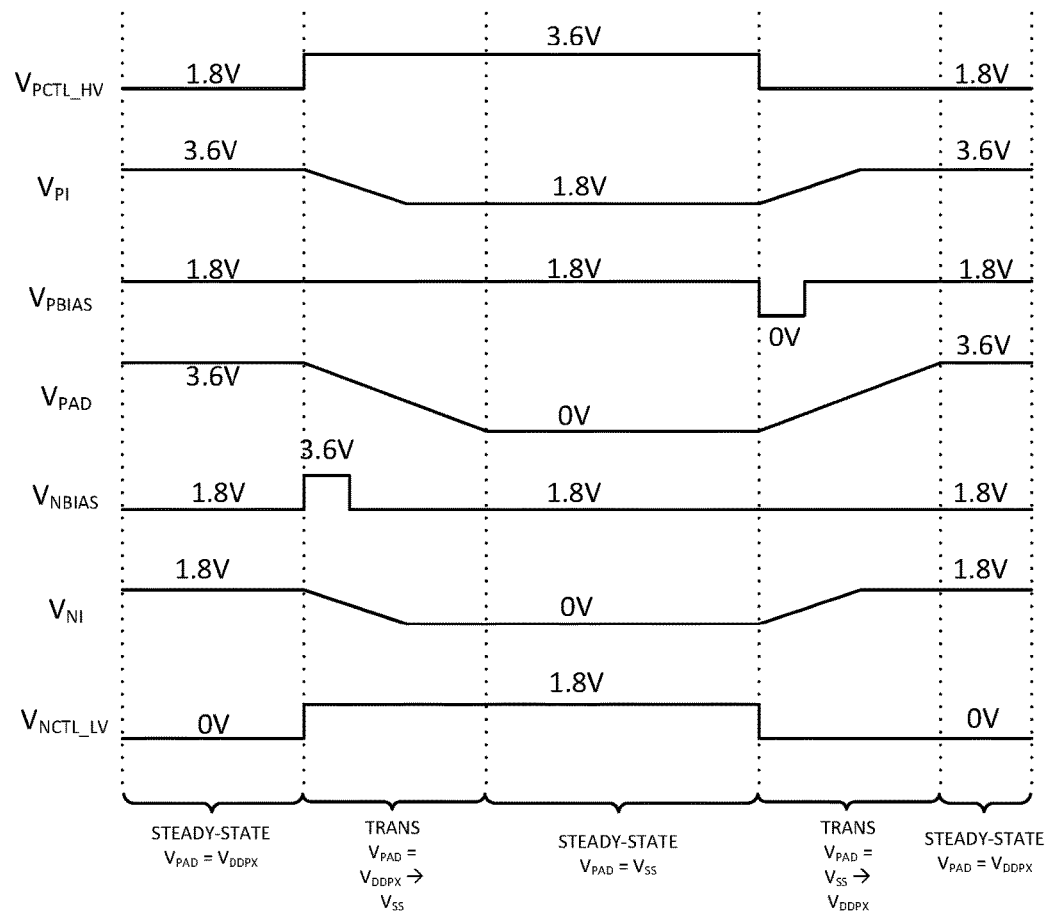
FIG. 2B illustrates a timing diagram associated with an exemplary operation of the I/O driver of FIG. 2A in accordance with another aspect of the disclosure.

FIG. 2B illustrates a timing diagram associated with an exemplary operation of the I/O driver 200 in accordance with another aspect of the disclosure. For explanation purposes, $V_{DDPX}$ is 3.6V, $V_{DDIX}$ is 1.8V, and $V_{SS}$ is 0V. Also, for explanation purposes, the maximum reliability voltage for $V_{DS}$, $V_{GS}$, and $V_{DG}$ of devices $M_{P21}$, $M_{P22}$, $M_{N22}$, and $M_{N21}$ is 2.0V. It shall be understood that such voltages and maximum reliability voltages may be different in various implementations based on the type of devices and applications used for the I/O driver 200.

Similar to the graph of FIG. 1B, the x- or horizontal axis of the timing diagram represents time, and is divided into four states or time intervals: (1) when the output voltage $V_{PAD}$ of the I/O driver 200 is at a steady-state high logic voltage $V_{DDPX}$, which is indicated in the right-most and left-most columns of the timing diagram; (2) when the output voltage $V_{PAD}$ is transitioning from the high logic voltage $V_{DDPX}$ to a low logic voltage $V_{SS}$, which is indicated in the second column from the left; (3) when the output voltage $V_{PAD}$ is at a steady-state low logic voltage $V_{SS}$, which is indicated in the third column from the left; and (4) when the output voltage $V_{PAD}$ is transitioning from the low logic voltage $V_{SS}$ to the high logic voltage $V_{DDPX}$, which is indicated in the fourth column from the left.

The y- or vertical axis of the timing diagram represents the various voltages of the I/O driver 200. For instance, from top to bottom, the voltages are: (1) the control voltage $V_{PCTL\_HV}$ for PMOS $M_{P11}$; (2) the defined voltage $V_{PI}$ at the source of PMOS $M_{P12}$; (3) the gate bias voltage $V_{PBIAS}$ for PMOS $M_{P12}$; (4) the output voltage $V_{PAD}$, (5) the gate bias voltage $V_{NBIAS}$ for NMOS $M_{N12}$; (6) the defined voltage $V_{NI}$ at the source of NMOS $M_{N12}$; and (7) the control voltage $V_{NCTL\_LV}$ for NMOS $M_{N11}$.

When the output voltage $V_{PAD}$ is at a high logic voltage $V_{DDPX}$ (3.6V) as indicated by the left-most and right-most columns, the control voltage $V_{PCTL\_HV}$ is at a low logic voltage $V_{DDIX}$ (1.8V) to turn on PMOS $M_{P21}$, the defined voltage $V_{PI}$ at the source of PMOS $M_{P22}$ is at $V_{DDPX}$ (3.6V), and the bias voltage $V_{PBIAS}$ is at a relatively high voltage $V_{DDIX}$ (1.8V), which causes PMOS $M_{P22}$ to turn on in response to PMOS $M_{P21}$ turning on. Accordingly, the output voltage $V_{PAD}$ is at a high logic voltage $V_{DDPX}$ (3.6V) due to the first voltage rail being coupled to the output via the turned-on PMOS $M_{P21}$ and $M_{P22}$.

Also, when the output voltage $V_{PAD}$ is at the high logic voltage $V_{DDPX}$ (3.6V), the control voltage $V_{NCTL\_LV}$ is at a low logic voltage $V_{SS}$ (0V) to turn off NMOS $M_{N21}$, the defined voltage $V_{NI}$ is at $V_{DDIX}$ (1.8V) to maintain the $V_{DS}$ of NMOS $M_{N22}$ below its reliability limit, and the bias voltage $V_{NBIAS}$ is at a relatively low voltage $V_{DDIX}$ (1.8V) to turn off NMOS $M_{N22}$. Accordingly, the output is decoupled from the second voltage rail ($V_{SS}$) due to the turned-off NMOS $M_{N22}$ and $M_{N21}$.

To transition the output voltage $V_{PAD}$ from the high logic voltage $V_{DDPX}$ (3.6V) towards the low logic voltage $V_{SS}$ (0V) as indicated in the second column from the left, the control voltage $V_{NCTL\_HV}$ is changed from the low logic voltage $V_{SS}$ (0V) to the high logic voltage $V_{DDIX}$ (1.8V) to turn on NMOS $M_{N21}$. Simultaneous with $V_{NCTL\_LV}$ changing from low to high, the bias voltage $V_{NBIAS}$ is raised from a relatively low bias voltage (e.g., ~$V_{DDIX}$ (1.8V)) to a relatively high bias voltage (e.g., ~$V_{DDPX}$ (3.6V)). This is done to configure the respective turn-on resistances of NMOS $M_{N21}$ and $M_{N22}$ to be more equalized (e.g., substantially the same) when the output voltage $V_{PAD}$ initially transitions from high-to-low. This causes the 3.6V voltage drop between $V_{PAD}$ and $V_{SS}$ to be equally divided among NMOS $M_{N22}$ and $M_{N21}$; thus, causing the devices to each see a voltage drop of substantially 1.8V, which is below the 2.0V reliability limit.

When the output voltage $V_{PAD}$ has decreased to a defined voltage level, the bias voltage $V_{NBIAS}$ is brought back to the relatively low bias voltage (e.g., ~$V_{DDIX}$ (1.8V)). The time interval in which the $V_{NBIAS}$ is at the relatively high bias voltage (e.g., ~$V_{DDPX}$ (3.6V)) should be controlled to prevent over-voltage of NMOS $M_{N22}$. For instance, if the time interval is too short, then NMOS $M_{N22}$ may be subjected to over-voltage due to its $V_{DS}$ being above the reliability limit. If, on the other hand, the time interval is too long, then the device $M_{N22}$ may be subjected to over-voltage due to its gate-to-source voltage ($V_{GS}$) and/or gate-to-drain voltage ($V_{GD}$) being above the reliability limit.

The time interval depends on the rate at which the output voltage $V_{PAD}$ decreases from $V_{DDPX}$ to $V_{SS}$. Such rate depends on the capacitive load $C_{LOAD}$ coupled to the output of the I/O driver 200. If the capacitance $C_{LOAD}$ of the load is relatively small, then the time interval should be relatively short because the rate at which output voltage $V_{PAD}$ is decreasing is relatively high. If the capacitance $C_{LOAD}$ of the load is relatively large, then the time interval should be relatively long because the rate at which output voltage $V_{PAD}$ is decreasing is relatively low. Accordingly, the $V_{NBIAS}$ voltage generator 222 generates the raised $V_{NBIAS}$ voltage based on the rate at which output voltage $V_{PAD}$ transitions from high-to-low.

Further, to facilitate the transition of the output voltage $V_{PAD}$ from the high logic voltage $V_{DDPX}$ (3.6V) towards the low logic voltage $V_{SS}$ (0V), the control voltage $V_{PCTL\_HV}$ is changed from the low logic voltage $V_{DDIX}$ (1.8V) to the high logic voltage $V_{DDPX}$ (3.6V) to turn off PMOS $M_{P21}$. In response to the output voltage $V_{PAD}$ decreasing to a defined voltage level, the $V_{PI}$ voltage generator 214 generates a defined voltage $V_{PI}$ substantially at $V_{DDIX}$ (1.8V). As the bias voltage $V_{PBIAS}$ applied to gate of PMOS $M_{P22}$ is maintained constant at $V_{DDIX}$ (1.8V) during the transition of the output voltage $V_{PAD}$ from high-to-low, PMOS $M_{P22}$ turns off because its $V_{GS}$ is substantially at 0V. Accordingly, during the transition of the output voltage $V_{PAD}$ from high-to-low, the pull-up circuit decouples the output from the first voltage rail ($V_{DDPX}$) due to the turned off PMOS $M_{P21}$ and $M_{P22}$.

When the output voltage $V_{PAD}$ is at a steady-state low logic voltage $V_{SS}$ (0V) as indicated in the third column from the left, the control voltage $V_{NCTL\_LV}$ is at the high logic voltage $V_{DDIX}$ (1.8V) to maintain NMOS $M_{N21}$ turned on, the bias voltage $V_{NBIAS}$ is at a low bias voltage $V_{DDIX}$ (1.8V) (relative compared to $V_{DDPX}$), which maintains NMOS $M_{N22}$ turned on. Thus, output voltage $V_{PAD}$ receives $V_{SS}$ (0V) from the second voltage rail via the turned-on NMOS $M_{N21}$ and $M_{N22}$. It follows that the defined voltage $V_{NI}$ is also at $V_{SS}$ (0V).

Also, when the output voltage $V_{PAD}$ is at the steady-state low logic voltage $V_{SS}$ (0V), the bias voltage $V_{PCTL\_HV}$ is at a high logic voltage $V_{DDPX}$ (3.6V) to maintain PMOS $M_{P21}$ turned off, the defined voltage $V_{PI}$ is at $V_{DDIX}$ (1.8V) to protect PMOS $M_{P22}$ from over-voltage as discussed, and the bias voltage $V_{PBIAS}$ is at a high bias voltage $V_{DDIX}$ (1.8V) (compared to $V_{SS}$), which maintains PMOS $M_{P22}$ turned off. Thus, the output of the I/O driver 200 is decoupled from the first voltage rail ($V_{DDPX}$) via the turned-off PMOS $M_{P21}$ and $M_{P22}$.

To transition the output voltage $V_{PAD}$ from the low logic voltage $V_{SS}$ (0V) towards the high logic voltage $V_{DDPX}$ (3.6V) as indicated in the fourth column from the left, the control voltage $V_{PCTL\_HV}$ is changed from the high logic voltage $V_{DDPX}$ (3.6V) to the low logic voltage $V_{DDIX}$ (1.8V) to turn on PMOS $M_{P21}$. Simultaneous with $V_{PCTL\_HV}$ changing from high to low, the bias voltage $V_{PBIAS}$ is lowered from the relatively high bias voltage (e.g., ~$V_{DDIX}$ (1.8V)) to a relatively low bias voltage (e.g., $V_{SS}$ (0V)). This is done to configure the respective turn-on resistances of PMOS $M_{P21}$ and $M_{P22}$ to be more equalized (e.g., substantially the same) when the output voltage $V_{PAD}$ initially transitions from low-to-high. This causes the 3.6V voltage drop between $V_{DDPX}$ and $V_{PAD}$ to be divided equally among PMOS $M_{P22}$ and $M_{P21}$; thus, causing the devices to each see a voltage drop of substantially 1.8V, which is below the 2.0V reliability limit.

When the output voltage $V_{PAD}$ has increased to a defined voltage level, the bias voltage $V_{PBIAS}$ is brought back to the relatively high bias voltage (e.g., ~$V_{DDIX}$ (1.8V)). The time interval in which the $V_{PBIAS}$ is at the relatively low bias voltage (e.g., ~$V_{SS}$ (0V)) should be controlled to prevent over-voltage of PMOS $M_{P22}$. For instance, if the time interval is too short, then PMOS $M_{P22}$ may be subjected to over-voltage due to its $V_{DS}$ being above the reliability limit. If, on the other hand, the time interval is too long, then the device $M_{P22}$ may be subjected to over-voltage due to its gate-to-source voltage ($V_{GS}$) and/or gate-to-drain ($V_{GD}$) being above the reliability limit.

The time interval depends on the rate at which the output voltage $V_{PAD}$ increases from $V_{SS}$ to $V_{DDPX}$. Such rate depends on the capacitive load $C_{LOAD}$ coupled to the output of the I/O driver 200. If the capacitance $C_{LOAD}$ of the load is relatively small, then the time interval should be relatively short because the rate at which output voltage $V_{PAD}$ is increasing is relatively high. If the capacitance $C_{LOAD}$ of the load is relatively large, then the time interval should be relatively long because the rate at which output voltage $V_{PAD}$ is increasing is relatively low. Accordingly, the $V_{PBIAS}$ voltage generator 212 generates the lowered $V_{PBIAS}$ voltage based on the rate at which output voltage $V_{PAD}$ transitions from low-to-high.

Further, to facilitate the transition the output voltage $V_{PAD}$ from the low logic voltage $V_{SS}$ (0V) towards the high logic voltage $V_{SS}$ (3.6V), the control voltage $V_{NCTL\_LV}$ is changed from the high logic voltage $V_{DDIX}$ (1.8V) to the low logic voltage $V_{SS}$ (0V) to turn off NMOS $M_{N21}$. In response to the output voltage $V_{PAD}$ increasing to a defined voltage level, the $V_{NI}$ voltage generator 224 generates a defined voltage $V_{NI}$ substantially at $V_{DDIX}$ (1.8V). As the bias voltage $V_{NBIAS}$ applied to gate of NMOS $M_{N22}$ is maintained constant at $V_{DDIX}$ (1.8V) during the transition of the output voltage $V_{PAD}$ from low-to-high, NMOS $M_{N22}$ turns off because its $V_{GS}$ is substantially at 0V. Accordingly, during the transition of the output voltage $V_{PAD}$ from low-to-high, the pull-down circuit decouples the output from the second voltage rail ($V_{SS}$) due to the turned off NMOS $M_{N21}$ and $M_{N22}$.

Figure 2C:
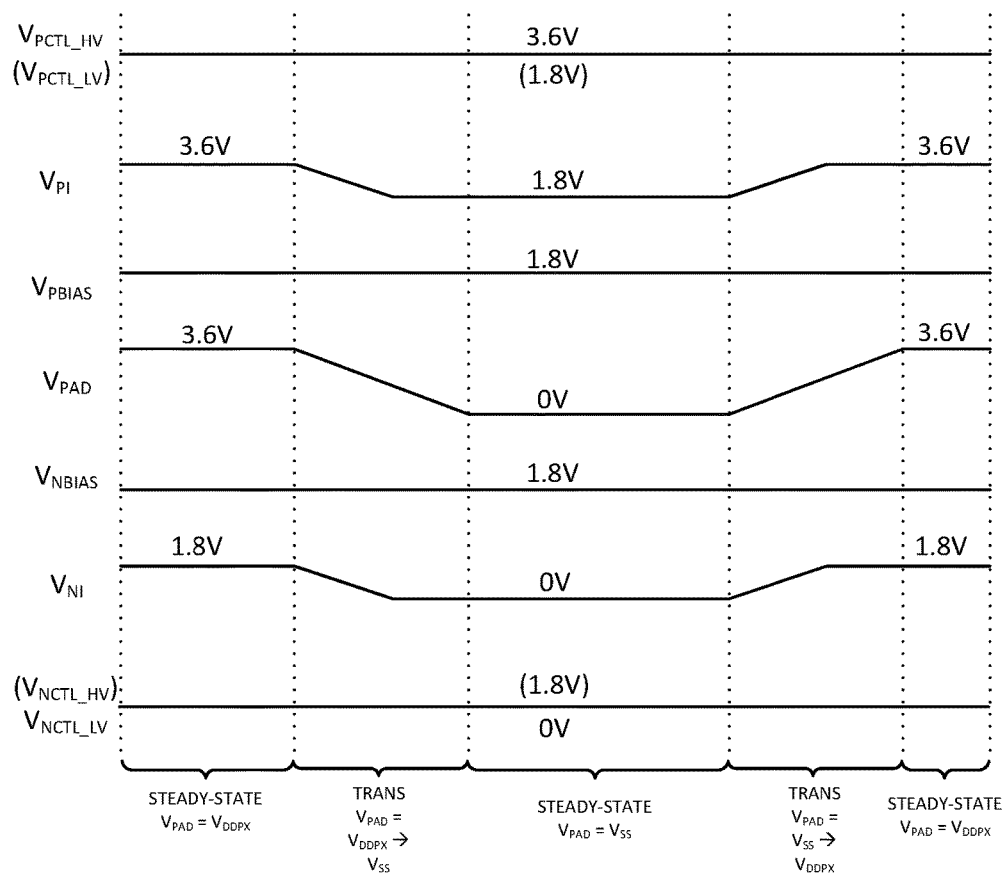
FIG. 2C illustrates a timing diagram associated with another exemplary operation of the I/O driver of FIG. 2A in accordance with another aspect of the disclosure.

FIG. 2C illustrates a timing diagram associated with another exemplary operation of the I/O driver 200 in accordance with another aspect of the disclosure. The I/O driver 200 may be configured as a tristate device, where the I/O driver may produce a high logic voltage, a low logic voltage, or high impedance at its output. Accordingly, the timing diagram depicted in FIG. 2C relates to the operation of the I/O driver 200 when it produces a high impedance at its output.

As illustrated in FIG. 2A, the first and second PMOS predrivers 210 and 211, and the first and second NMOS predrivers 220 and 221 each receive an enable (EN) signal. When the EN signal is asserted, the I/O driver 200 operates to output a high logic voltage or low logic voltage based on the input voltage $V_{IN}$, as previously discussed. When the EN signal is not asserted, the I/O driver 200 is configured to produce high impedance at the output to allow other one or more external devices to drive a transmission line or load coupled to the output. The I/O driver 200 produces the high impedance at its output by turning off the pull-up circuit (e.g., turning off PMOS $M_{P21}$ and $M_{P22}$) and the pull-down circuit (e.g., turning off NMOS $M_{N22}$ and $M_{N21}$).

More specifically, when the EN signal is not asserted, the first PMOS predriver 210 generates the control voltage $V_{PCTL\_HV}$ at the high logic voltage $V_{DDPX}$ (3.6V) and the second PMOS predriver 211 generates the control voltage $V_{PCTL\_LV}$ at the high logic voltage $V_{DDIX}$ (1.8V) regardless of the logic state of the input voltage $V_{IN}$ and the output voltage $V_{PAD}$. The control voltage $V_{PCTL\_HV}$ being maintained at the high logic voltage $V_{DDPX}$ (3.6V) maintains PMOS $M_{P21}$ turned off while the I/O driver 200 is operated to produce high impedance at the output. The control voltage $V_{PCTL\_HV}$ being at the high logic voltage $V_{DDIX}$ (1.8V) causes the $V_{PBIAS}$ voltage generator 212 to generate the bias voltage $V_{PBIAS}$ at a constant relatively high bias voltage $V_{DDIX}$ (1.8V). The timing diagram of FIG. 2C depicts $V_{PCTL\_HV}$ and $V_{PCTL\_LV}$ at constant voltages $V_{DDPX}$ (3.6V) and $V_{DDIX}$ (1.8V) while the I/O driver 200 is configured to output a high impedance.

Similarly, when the EN signal is not asserted, the first NMOS predriver 220 generates the control voltage $V_{NCTL\_LV}$ at the low logic voltage $V_{SS}$ (0V) and the second NMOS predriver 221 generates the control voltage $V_{NCTL\_HV}$ at the low logic voltage $V_{DDIX}$ (1.8V) regardless of the logic state of the input voltage $V_{IN}$ and the output voltage $V_{PAD}$. The control voltage $V_{NCTL\_LV}$ being maintained at the low logic voltage $V_{SS}$ (0V) maintains NMOS $M_{N21}$ turned off while the I/O driver 200 is operated to produce a high impedance at the output. The control voltage $V_{NCTL\_HV}$ being at the low logic voltage $V_{DDIX}$ (1.8V) causes the $V_{NBIAS}$ voltage generator 212 to generate the bias voltage $V_{NBIAS}$ at a constant relatively low bias voltage $V_{DDIX}$ (1.8V). The timing diagram of FIG. 2C depicts both $V_{NCTL\_LV}$ and $V_{NCTL\_HV}$ at constant voltages $V_{SS}$ (0V) and $V_{DDIX}$ (1.8V) while the I/O driver 200 is configured to output a high impedance.

The control voltage $V_{PCTL\_HV}$ being at the constant high logic voltage $V_{DDPX}$ (3.6V) causes the $V_{PI}$ voltage generator 214 to generate the defined voltage $V_{PI}$ to maintain PMOS $M_{P22}$ turned off and protected from over-voltage while the I/O driver 200 is configured to output a high impedance. For instance, when the output voltage $V_{PAD}$ is driven to a high logic voltage $V_{DDPX}$ (3.6V) by another device, the $V_{PI}$ voltage generator 214 generates the defined voltage $V_{PI}$ at $V_{DDPX}$ (3.6V), as illustrated in the timing diagram of FIG. 2C. Thus, PMOS $M_{P22}$ is effectively turned off as its $V_{DS}$ is 0V and the maximum voltage across PMOS $M_{P22}$ is $V_{GS}$ and $V_{GD}$ at 1.8V, which is below the reliability limit of 2.0V for certain device technology. When the output voltage $V_{PAD}$ is driven to a low logic voltage $V_{SS}$ (0V) by another device, the $V_{PI}$ voltage generator 214 generates the defined voltage $V_{PI}$ at $V_{DDIX}$ (1.8V), as illustrated in the timing diagram of FIG. 2C. Thus, the maximum voltage across PMOS $M_{P22}$ is $V_{DS}$ 1.8V, which is also below the reliability limit of 2.0V for certain device technology.

The control voltage $V_{NCTL\_LV}$ being at the constant low logic voltage $V_{SS}$ (0V) causes the $V_{NI}$ voltage generator 224 to generate the defined voltage $V_{NI}$ to maintain NMOS $M_{N22}$ turned off and protected from over-voltage while the I/O driver 200 is configured to output a high impedance. For instance, when the output voltage $V_{PAD}$ is driven to a low logic voltage $V_{SS}$ (0V) by another device, the $V_{NI}$ voltage generator 224 generates the defined voltage $V_{NI}$ at $V_{SS}$ (0V), as illustrated in the timing diagram of FIG. 2C. Thus, NMOS $M_{P22}$ is effectively turned off as its $V_{DS}$ is 0V and the maximum voltage across NMOS $M_{N22}$ is $V_{GS}$ and $V_{GD}$ at 1.8V, which is below the reliability limit of 2.0V for certain device technology. When the output voltage $V_{PAD}$ is driven to a high logic voltage $V_{DDPX}$ (3.6V) by another device, the $V_{NI}$ voltage generator 224 generates the defined voltage $V_{NI}$ at $V_{DDIX}$ (1.8V), as illustrated in the timing diagram of FIG. 2C. Thus, the maximum voltage across NMOS $M_{N22}$ is $V_{DS}$ 1.8V, which is also below the reliability limit of 2.0V for certain device technology.

Figure 3A:
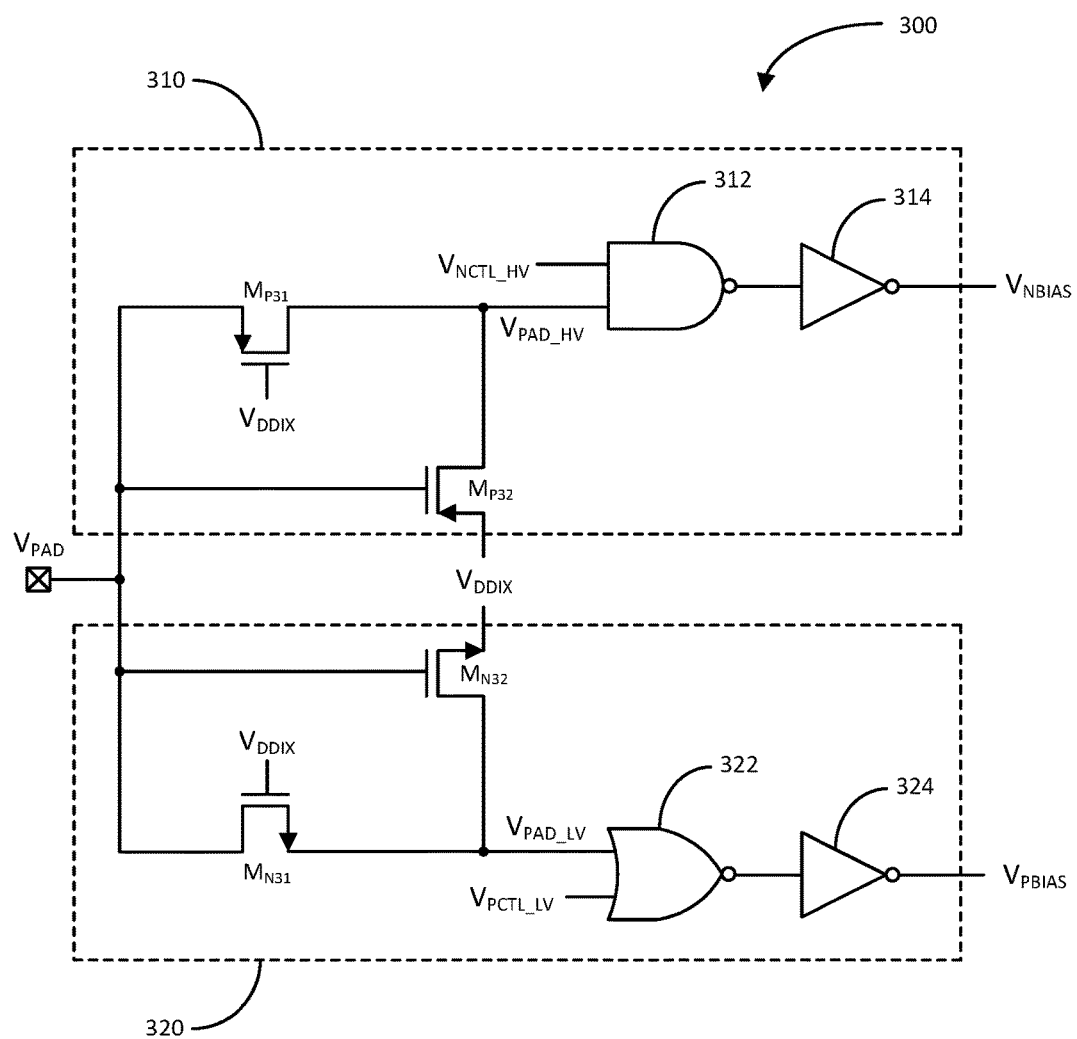
FIG. 3A illustrates a schematic diagram of an exemplary gate bias voltage generator in accordance with another aspect of the disclosure.

FIG. 3A illustrates a schematic diagram of an exemplary bias voltage generator 300 including a $V_{NBIAS}$ voltage generator 310 and a $V_{PBIAS}$ voltage generator 320. The $V_{NBIAS}$ voltage generator 310 and the $V_{PBIAS}$ voltage generator 320 may be one exemplary detailed implementation of $V_{NBIAS}$ voltage generator 222 and $V_{PBIAS}$ voltage generator 212 of I/O driver 200, respectively.

In particular, the $V_{NBIAS}$ voltage generator 310 includes a PMOS $M_{P31}$, a PMOS $M_{P32}$, a NAND gate 312, and an inverter 314. The PMOS $M_{P31}$ includes source and drain coupled between the output ($V_{PAD}$) of the I/O driver 200 and a first input of the NAND gate 312. The gate of PMOS $M_{P31}$ is configured to receive the constant bias voltage $V_{DDIX}$. The PMOS $M_{P32}$ includes source and drain coupled between a source of the constant bias voltage $V_{DDIX}$ and the first input of the NAND gate 312. The gate of $M_{P32}$ is coupled to the output ($V_{PAD}$) of the I/O driver 200. The control voltage $V_{NCTL\_HV}$ is applied to a second input of the NAND gate 312. The output of the NAND gate 312 is coupled to an input of the inverter 314. The bias voltage $V_{NBIAS}$ is generated at the output of the inverter 314.

The $V_{PBIAS}$ voltage generator 320 includes an NMOS $M_{N31}$, an NMOS $M_{N32}$, a NOR gate 322, and an inverter 324. The NMOS $M_{N31}$ includes drain and source coupled between the output ($V_{PAD}$) of the I/O driver 200 and a first input of the NOR gate 322. The gate of NMOS $M_{N31}$ is configured to receive the constant bias voltage $V_{DDIX}$. The NMOS $M_{N32}$ includes source and drain coupled between the source of the constant bias voltage $V_{DDIX}$ and the first input of the NOR gate 322. The gate of $M_{N32}$ is coupled to the output ($V_{PAD}$) of the I/O driver 200. The control voltage $V_{PCTL\_LV}$ is applied to a second input of the NOR gate 322. The output of the NOR gate 322 is coupled to an input of the inverter 324. The bias voltage $V_{PBIAS}$ is generated at the output of the inverter 324.

The circuit including PMOS $M_{P31}$ and $M_{P32}$ and NMOS $M_{N31}$ and $M_{N32}$ operate as a waveform splitter. That is, as discussed, the voltage domain for the output voltage $V_{PAD}$ has high and low logic voltages at $V_{DDPX}$ and $V_{SS}$, respectively. The portion of the waveform splitter having PMOS $M_{P31}$ and $M_{P32}$ generates the signal $V_{PAD\_HV}$ that tracks the high and low logic voltages of the output voltage $V_{PAD}$ but in a different voltage domain having high and low voltages at $V_{DDPX}$ and $V_{DDIX}$, respectively. Similarly, the portion of the waveform splitter having NMOS $M_{N31}$ and $M_{N32}$ generates the signal $V_{PAD\_LV}$ that tracks the high and low logic voltages of the output voltage $V_{PAD}$ but in a different voltage domain having high and low voltages at $V_{DDIX}$ and $V_{SS}$, respectively.

Figure 3B:
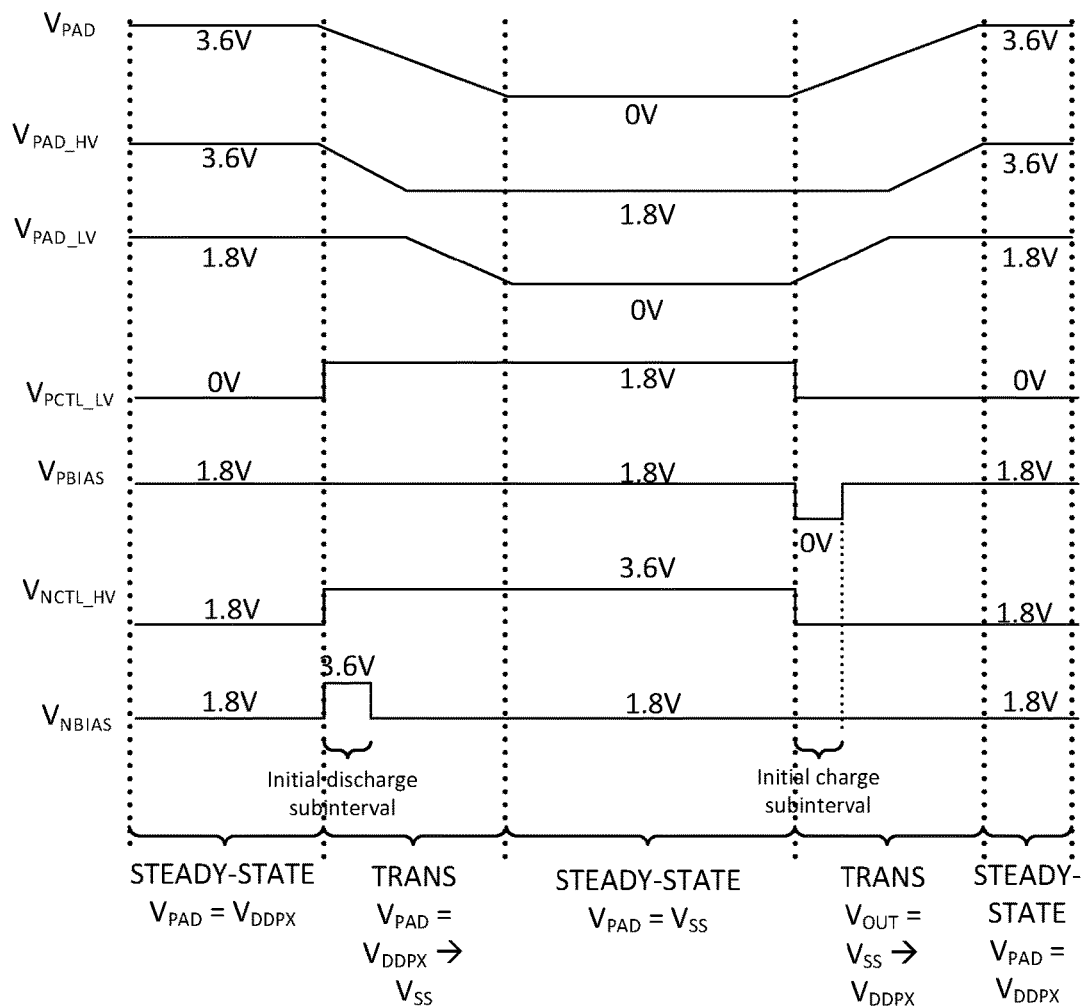
FIG. 3B illustrates a timing diagram related to an exemplary operation of the gate bias voltage generator of FIG. 3A in accordance with another aspect of the disclosure.

FIG. 3B illustrates a timing diagram related to exemplary operations of the I/O driver 200, $V_{NBIAS}$ voltage generator 310, and $V_{PBIAS}$ voltage generator 320 in accordance with another aspect of the disclosure. The x- or horizontal axis of the timing diagram represents time, and is divided into four primary time intervals: (1) when the output voltage $V_{PAD}$ of the I/O driver 200 is substantially at a steady-state high logic voltage $V_{DDPX}$ (3.6V), which is indicated in the left-most and right-most columns of the timing diagram; (2) when the output voltage $V_{PAD}$ is transitioning from the high logic voltage $V_{DDPX}$ (3.6V) to a low logic voltage $V_{SS}$ (0V), which is indicated in the second column from the left; (3) when the output voltage $V_{PAD}$ of the I/O driver 200 is substantially at a steady-state low logic voltage $V_{SS}$ (0V), which is indicated in the third column from the left; and (4) when the output voltage $V_{PAD}$ is transitioning from the low logic voltage $V_{SS}$ (0V) to the high logic voltage $V_{DDPX}$ (3.6V), which is indicated in the fourth column from the left.

The y- or vertical axis of the timing diagram represents the various voltages of the I/O driver 200, $V_{NBIAS}$ voltage generator 310, and $V_{PBIAS}$ voltage generator 320. For instance, from top to bottom, the voltages are: (1) the output voltage $V_{PAD}$ at the output of the I/O driver 200; (2) the voltage $V_{PAD\_HV}$ at the first input of the NAND gate 312; (3) the voltage $V_{PAD\_LV}$ at the first input of the NOR gate 322; (4) the control voltage $V_{PCTL\_LV}$ at the second input of the NOR gate 322 (generated by the second PMOS predriver 211); (5) the gate bias voltage $V_{PBIAS}$ for PMOS $M_{P22}$; (6) the control voltage $V_{NCTL\_HV}$ at the second input of the NAND gate 312 (generated by the second NMOS predriver 221); and (7) the gate bias voltage $V_{NBIAS}$ for NMOS $M_{N22}$.

In operation, when the output voltage $V_{PAD}$ of the I/O driver 200 is at the steady-state high logic voltage $V_{DDPX}$ (3.6V), PMOS $M_{P31}$ is turned on because its source is at $V_{DDPX}$ (3.6V) and its gate is at $V_{DDIX}$ (1.8V); thus, PMOS $M_{P31}$ has a $V_{GS}$ of 1.8V, which is greater than its threshold voltage $V_T$ of 0.4V. Additionally, PMOS $M_{P32}$ is turned off because its source is at $V_{DDPX}$ (3.6V) and its gate is at $V_{DDPX}$ (3.6V); thus, PMOS $M_{P32}$ has a $V_{GS}$ of 0V, which is less than its threshold voltage $V_T$ of 0.4V. Accordingly, the voltage $V_{PAD\_HV}$ at the first input of the NAND gate 312 is at a high logic voltage $V_{DDPX}$ (3.6V). The voltage $V_{NCTL\_HV}$ is at a low logic voltage of $V_{DDIX}$ (1.8V). Thus, since the inputs to the NAND gate 312 are high and low logic voltages, the NAND gate 312 generates a high logic voltage, and the inverter 314 outputs $V_{NBIAS}$ as a relatively low bias voltage $V_{DDIX}$ (1.8V), as indicated in the timing diagram of FIG. 3B.

Also, when the output voltage $V_{PAD}$ of the I/O driver 200 is the steady-state high logic voltage $V_{DDPX}$ (3.6V), NMOS $M_{N32}$ is turned on because its gate is at $V_{DDPX}$ (3.6V) and its source is at $V_{DDIX}$ (1.8V); thus, NMOS $M_{N32}$ has a $V_{GS}$ of 1.8V, which is greater than its threshold voltage $V_T$ of 0.4V. Thus, since $M_{N32}$ is turned on, the voltage $V_{PAD\_LV}$ at the first input of the NOR gate 322 is at a high logic voltage $V_{DDIX}$ (1.8V). NMOS $M_{N31}$ is turned off since its gate is at $V_{DDIX}$ (1.8V) and its source is at $V_{DDIX}$ (1.8V); thus, NMOS $M_{N32}$ has a $V_{GS}$ of 0V, which is less than its threshold voltage $V_T$ of 0.4V. The voltage $V_{PCTL\_LV}$ is at a low logic voltage of $V_{SS}$ (0V). Thus, since the inputs to the NOR gate 322 are high and low logic voltages, the NOR gate 322 generates a low logic voltage, and the inverter 324 outputs $V_{PBIAS}$ as a relatively high bias voltage $V_{DDIX}$ (1.8V), as indicated in the timing diagram of FIG. 3B.

When the output voltage $V_{PAD}$ is to be transitioned from the high logic voltage $V_{DDPX}$ (3.6V) to a low logic voltage $V_{SS}$ (0V), the control voltage $V_{NCTL\_HV}$ is raised to a logic high voltage $V_{DDPX}$ (3.6V) and $V_{PCTL\_LV}$ is raised to a high logic voltage $V_{DDIX}$ (1.8V). Accordingly, the inputs to the NAND gate 312 are both at high logic voltages; and thus, the NAND gate 312 outputs a low logic voltage and the inverter 314 outputs $V_{NBIAS}$ as a relatively high bias voltage $V_{DDPX}$ (3.6V). As previously discussed, $V_{NBIAS}$ being high configures the NMOS $M_{N22}$ of I/O driver 200 to have similar resistance as the resistance of NMOS $M_{N21}$ so that the voltages across the devices $M_{N21}$ and $M_{N22}$ are substantially equal to prevent an over-voltage of the devices.

When the output voltage $V_{PAD}$ has decreased to a defined voltage where $V_{PAD\_HV}$ is interpreted by the NAND gate 312 as a low logic voltage, the inputs to the NAND gate 312 are at low and high logic voltages; and accordingly, the NAND gate 312 generates a high logic voltage, and the inverter 314 outputs $V_{NBIAS}$ as a relatively low bias voltage $V_{DDIX}$ (1.8V). At such time, the output voltage $V_{PAD}$ has sufficiently decreased to prevent over-voltage of NMOS $M_{N22}$ and $M_{N21}$ of I/O driver 200. PMOS $M_{P32}$ turns on when the output voltage $V_{PAD}$ has decreased to substantially $V_{DDIX}-V_T$ (threshold of $M_{P32}$) and PMOS $M_{P31}$ turns off when the output voltage $V_{PAD}$ has decreased to $V_{DDIX}+V_T$ (threshold of $M_{P31}$).

Thus, as indicated in the timing diagram of FIG. 3B, the bias voltage $V_{NBIAS}$ is temporarily raised during an initial portion or discharge subinterval of the transition of the output voltage $V_{PAD}$ from high-to-low to prevent an over-voltage condition of NMOS $M_{N22}$ and $M_{N21}$. The time interval in which $V_{NBIAS}$ is at the raised state depends on when the voltage $V_{PAD\_HV}$ becomes a low logic voltage as interpreted by the NAND gate 312. The output voltage $V_{PAD}$ decreases at a rate that depends on the capacitive load $C_{LOAD}$; e.g., small capacitive load $C_{LOAD}$, faster rate of decrease for $V_{PAD}$, larger capacitive load $C_{LOAD}$, slower rate of decrease for $V_{PAD}$. Thus, the bias voltage $V_{NBIAS}$ is held at the raised state for sufficient amount of time to prevent an over-voltage NMOS $M_{N22}$ due to $V_{DS}$ being above the reliability limit if $V_{NBIAS}$ is otherwise brought to a lower bias voltage too early, and prevent an over-voltage of NMOS $M_{N22}$ due to $V_{GS}$ and/or $V_{GD}$ being above the reliability limit if $V_{NBIAS}$ is otherwise kept at the higher bias voltage for too long.

As indicated in the timing diagram of FIG. 3B, during the transition of the output voltage $V_{PAD}$ from high-to-low, the bias voltage $V_{PBIAS}$ remains at the relatively high bias voltage $V_{DDIX}$ (1.8V). This is because the control voltage $V_{PCTL\_LV}$ is raised to a high logic voltage $V_{DDIX}$ (1.8V) during the transition of the output voltage $V_{PAD}$ from high-to-low. In response to the high logic voltage $V_{PCTL\_LV}$; the NOR gate 322 generates a low logic voltage, and the inverter 324 maintains $V_{PBIAS}$ at the relatively high bias voltage $V_{DDIX}$ (1.8V).

When the output voltage $V_{PAD}$ is to be transitioned from the low logic voltage $V_{SS}$ (0V) to a high logic voltage $V_{DDPX}$ (3.6V), the control voltage $V_{PCTL\_LV}$ is lowered to a low logic voltage $V_{SS}$ (0V) and control voltage $V_{NCTL\_HV}$ is lowered to a low logic voltage $V_{DDIX}$ (1.8V). Accordingly, the inputs to the NOR gate 322 are both at low logic voltages; and thus, the NOR gate 322 outputs a high logic voltage and the inverter 324 outputs $V_{PBIAS}$ as a relatively low bias voltage $V_{SS}$ (0V). As previously discussed, $V_{PBIAS}$ being low configures the PMOS $M_{P22}$ of I/O driver 200 to have similar resistance as the resistance of PMOS $M_{P21}$ so that the voltages across the devices $M_{P21}$ and $M_{P22}$ are substantially equal to prevent an over-voltage of the devices.

When the output voltage $V_{PAD}$ has increased to a defined voltage where $V_{PAD\_LV}$ is interpreted by the NOR gate 322 as a high logic voltage, the NOR gate 322 generates a low logic voltage, and the inverter 324 outputs $V_{PBIAS}$ as a relatively high bias voltage $V_{DDIX}$ (1.8V). At such time, the output voltage $V_{PAD}$ has sufficiently increased to prevent over-voltage of PMOS $M_{P22}$ and $M_{P21}$ of I/O driver 200. NMOS $M_{N31}$ turns off when the output voltage $V_{PAD}$ has increased to substantially $V_{DDIX}-V_T$ (threshold of $M_{N31}$) and NMOS $M_{P32}$ turns on when the output voltage $V_{PAD}$ has increased to $V_{DDIX}+V_T$ (threshold of $M_{N32}$).

Thus, as indicated in the timing diagram of FIG. 3B, the bias voltage $V_{PBIAS}$ is temporarily lowered during an initial portion or charge subinterval of the transition of the output voltage $V_{PAD}$ from low-to-high to prevent an over-voltage condition of PMOS $M_{P22}$ and $M_{P21}$. The time interval in which $V_{PBIAS}$ is at the lowered state depends on when the voltage $V_{PAD\_LV}$ becomes a high logic voltage as interpreted by the NOR gate 322. The output voltage $V_{PAD}$ increases at a rate that depends on the capacitive load $C_{LOAD}$; e.g., small capacitive load $C_{LOAD}$, faster rate of increase for $V_{PAD}$; larger capacitive load $C_{LOAD}$, slower rate of increase for $V_{PAD}$. Thus, the bias voltage $V_{PBIAS}$ is held at the raised state for sufficient amount of time to prevent an over-voltage PMOS $M_{P22}$ due to $V_{DS}$ being above the reliability limit if $V_{PBIAS}$ is otherwise brought to a high bias voltage too early, and prevent an over-voltage of PMOS $M_{P22}$ due to $V_{GS}$ and/or $V_{GD}$ being above the reliability limit if $V_{PBIAS}$ is otherwise kept at the low bias voltage for too long.

As indicated in the timing diagram of FIG. 3B, during the transition of the output voltage $V_{PAD}$ from low-to-high, the bias voltage $V_{NBIAS}$ remains at the relatively low bias voltage $V_{DDIX}$ (1.8V). This is because the control voltage $V_{NCTL\_HV}$ is lowered to a low logic voltage $V_{SS}$ (0V) during the transition of the output voltage $V_{PAD}$ from low-to-high. In response to the logic high voltage $V_{NCTL\_HV}$, the NAND gate 312 generates a high logic voltage, and the inverter 314 maintains $V_{NBIAS}$ at the relatively low bias voltage $V_{DDIX}$ (1.8V).

Figure 4:
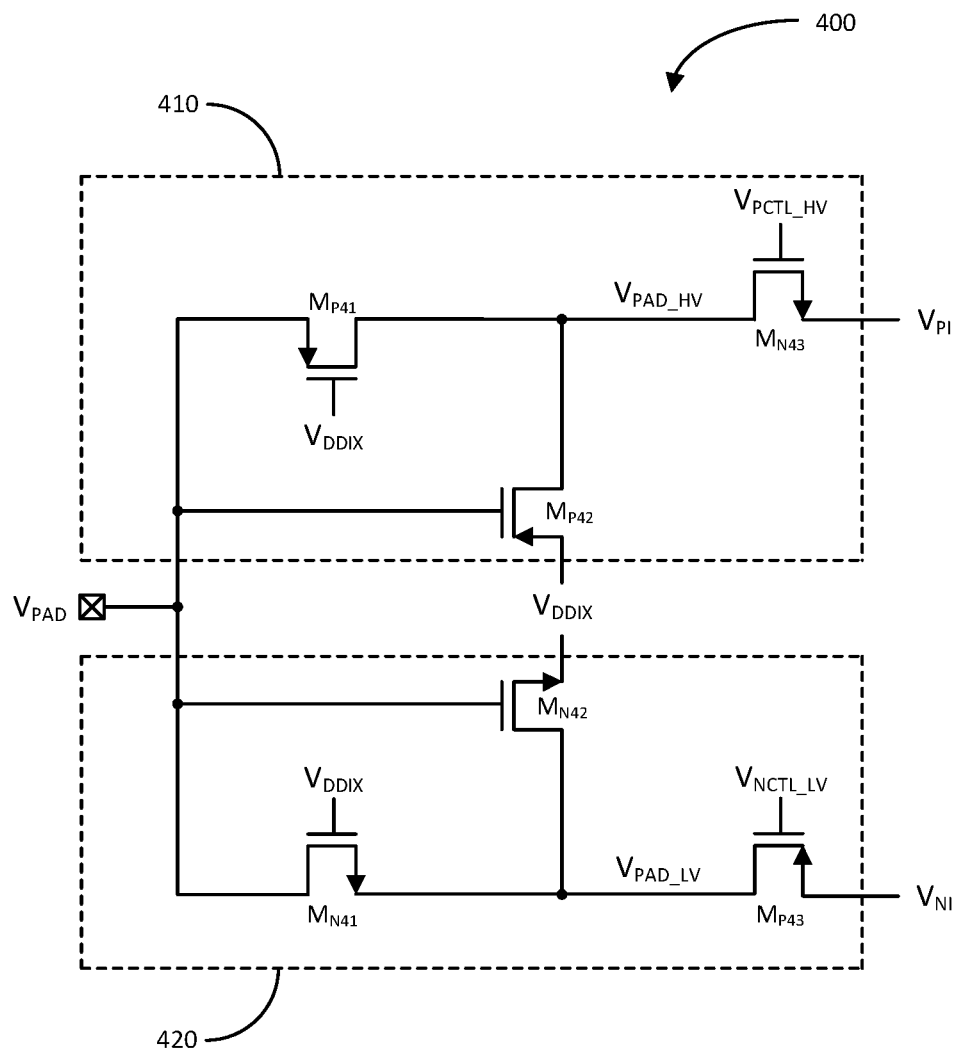
FIG. 4 illustrates a schematic diagram of an exemplary voltage generator in accordance with another aspect of the disclosure.

FIG. 4 illustrates a schematic diagram of an exemplary bias voltage generator 400 including $V_{PI}$ voltage generator 410 and $V_{NI}$ voltage generator 420. The $V_{PI}$ and $V_{NI}$ voltage generators 410 and 420 may be one exemplary detailed implementation of the $V_{PI}$ and $V_{NI}$ voltage generators 214 and 224 of I/O driver 200, respectively. As previously discussed, the $V_{PI}$ voltage generator 410 is configured to generate a defined voltage $V_{PI}$ at $V_{DDIX}$ (1.8V) when the output voltage $V_{PAD}$ is at steady-state low logic voltage $V_{SS}$ (0V). This is to protect PMOS $M_{P22}$ from an over-voltage condition. Similarly, the $V_{NI}$ voltage generator 420 is configured to generate a defined voltage $V_{NI}$ at $V_{DDIX}$ (1.8V) when the output voltage $V_{PAD}$ is at steady-state high logic voltage $V_{DDPX}$ (3.6V). This is to protect NMOS $M_{N22}$ from an over-voltage condition. This applies to both situations: (1) when the I/O driver 200 is driving the output voltage $V_{PAD}$, and (2) when the I/O driver 200 is presenting high impedance at the output and another device is driving the output voltage $V_{PAD}$.

In particular, the $V_{PI}$ voltage generator 410 includes a PMOS $M_{P41}$, a PMOS $M_{P42}$, and an NMOS $M_{N43}$. The PMOS $M_{P41}$ includes source and drain coupled between the output ($V_{PAD}$) of the I/O driver 200 and a drain of NMOS $M_{N43}$. The gate of PMOS $M_{P41}$ is configured to receive the constant bias voltage $V_{DDIX}$. The PMOS $M_{P42}$ includes source and drain coupled between a source of the constant bias voltage $V_{DDIX}$ and the drain of NMOS $M_{N43}$. The gate of PMOS $M_{P42}$ is coupled to the output ($V_{PAD}$) of the I/O driver 200. The gate of NMOS $M_{N43}$ is configured to receive the control voltage $V_{PCTL\_HV}$. The defined voltage $V_{PI}$ is generated at the source of $M_{N43}$.

The $V_{NI}$ voltage generator 420 includes an NMOS $M_{N41}$, an NMOS $M_{N42}$, and a PMOS $M_{P43}$. The NMOS $M_{N41}$ includes drain and source coupled between the output ($V_{PAD}$) of the I/O driver 200 and a drain of PMOS $M_{P43}$. The gate of $M_{N41}$ is configured to receive the constant bias voltage $V_{DDIX}$. The NMOS $M_{N42}$ includes source and drain coupled between the source of the constant bias voltage $V_{DDIX}$ and the drain of PMOS $M_{P43}$. The gate of NMOS $M_{N42}$ is coupled to the output ($V_{PAD}$) of the I/O driver 200. The gate of PMOS $M_{P43}$ is configured to receive the control voltage $V_{NCTL\_LV}$. The bias voltage $V_{NI}$ is generated at the source of $M_{P43}$.

The circuit including PMOS $M_{P41}$ and $M_{P42}$ and NMOS $M_{N41}$ and $M_{N42}$ operate as a waveform splitter. That is, as discussed, the voltage domain for the output voltage $V_{PAD}$ has high and low logic voltages at $V_{DDPX}$ and $V_{SS}$, respectively. The portion of the waveform splitter having PMOS $M_{P41}$ and $M_{P42}$ generates the signal $V_{PAD\_HV}$ that tracks the high and low logic voltages of the output voltage $V_{PAD}$ but in a different voltage domain having high and low voltages at $V_{DDPX}$ and $V_{DDIX}$, respectively. Similarly, the portion of the waveform splitter having NMOS $M_{N41}$ and $M_{N42}$ generates the signal $V_{PAD\_LV}$ that tracks the high and low logic voltages of the output voltage $V_{PAD}$ but in a different voltage domain having high and low voltages at $V_{DDIX}$ and $V_{SS}$, respectively.

Considering first the case where the I/O driver 200 is driving the output voltage $V_{PAD}$ to a high logic voltage $V_{DDPX}$ (3.6V). In such case, the control voltages $V_{PCTL\_HV}$ and $V_{NCTL\_LV}$ are at low logic voltages $V_{DDIX}$ (1.8V) and $V_{SS}$ (0V), respectively. With regard to $V_{PI}$ voltage generator 410, PMOS $M_{P41}$ is turned on, PMOS $M_{P42}$ is turned off, and NMOS $M_{N43}$ is effectively turned off. Thus, the defined voltage $V_{PI}$ is at $V_{DDPX}$ (3.6V) due to the turned on PMOS $M_{P11}$ and $M_{P22}$ of the pull-up circuit. With regard to $V_{NI}$ voltage generator 420, NMOS $M_{N42}$ is turned on, NMOS $M_{N41}$ is turned off, and PMOS $M_{P43}$ is turned on. Thus, the defined voltage $V_{NI}$ is at $V_{DDIX}$ (1.8V) via the turned on $M_{N42}$ and $M_{P43}$. The defined voltage $V_{NI}$ (1.8V) at the source of NMOS $M_{N22}$ protects the device from over-voltage when the output voltage $V_{PAD}$ is driven to a high logic voltage $V_{DDPX}$ (3.6V) by the I/O driver 200.

Considering next the case where the I/O driver 200 is driving the output voltage $V_{PAD}$ to a low logic voltage $V_{SS}$ (0V). In such case, the control voltages $V_{PCTL\_HV}$ and $V_{NCTL\_LV}$ are at high logic voltages $V_{DDPX}$ (3.6V) and $V_{DDIX}$ (1.8V), respectively. With regard to $V_{NI}$ voltage generator 420, NMOS $M_{N42}$ is turned off, NMOS $M_{N41}$ is turned on, and PMOS $M_{P43}$ is effectively turned off. Thus, the defined voltage $V_{NI}$ is at 0V ($V_{PAD}$) via the turned on $M_{N21}$ and $M_{N22}$ of the pull-down circuit. With regard to $V_{PI}$ voltage generator 410, PMOS $M_{P41}$ is turned off, PMOS $M_{P42}$ is turned on, and NMOS $M_{N43}$ is turned on. Thus, the voltage $V_{PI}$ is at $V_{DDIX}$ (1.8V) via the turned on $M_{P42}$ and $M_{N43}$. The defined voltage $V_{PI}$ (1.8V) at the source of PMOS $M_{P22}$ protects the device from over-voltage when the output voltage $V_{PAD}$ driven to a low logic voltage $V_{SS}$ (0V) by the I/O driver 200.

Considering next the case where the I/O driver 200 is providing high impedance at the output and another device is driving the output voltage $V_{PAD}$ to a high logic voltage $V_{DDPX}$ (3.6V). In such case, the control voltages $V_{PCTL\_HV}$ and $V_{NCTL\_LV}$ are at a high logic voltage $V_{DDPX}$ (3.6V) and a low logic voltage $V_{SS}$ (0V), respectively. With regard to $V_{PI}$ voltage generator 410, PMOS $M_{P41}$ is turned on, PMOS $M_{P42}$ is turned off, and NMOS $M_{N43}$ is turned on. Thus, the defined voltage $V_{PI}$ is at $V_{DDPX}$ (3.6V) via the turned on $M_{P41}$ and $M_{N43}$. With regard to $V_{NI}$ voltage generator 420, NMOS $M_{N42}$ is turned on, NMOS $M_{N41}$ is turned off, and PMOS $M_{P43}$ is turned on. Thus, the defined voltage $V_{NI}$ is at $V_{DDIX}$ (1.8V) via the turned on $M_{N42}$ and $M_{P43}$. The defined voltage $V_{NI}$ (1.8V) at the source of NMOS $M_{N22}$ protects the device from over-voltage when the output voltage $V_{PAD}$ driven to $V_{DDPX}$ (3.6V) by another device.

Considering next the case where the I/O driver 200 is providing a high impedance at the output and another device is driving the output voltage $V_{PAD}$ to a low logic voltage $V_{SS}$ (0V). In such case, the voltages $V_{PCTL\_HV}$ and $V_{NCTL\_LV}$ are at high logic voltage $V_{DDPX}$ (3.6V) and low logic voltage $V_{DDIX}$ (1.8V), respectively. With regard to $V_{NI}$ voltage generator 420, NMOS $M_{N42}$ is turned off, NMOS $M_{N41}$ is turned on, and PMOS $M_{P43}$ is turned on. Thus, the voltage $V_{NI}$ is at $V_{SS}$ (0V) via turned on $M_{N41}$ and $M_{P43}$. With regard to $V_{PI}$ voltage generator 410, PMOS $M_{P41}$ is turned off, PMOS $M_{P42}$ is turned on, and NMOS $M_{N43}$ is turned on. Thus, the defined voltage $V_{PI}$ is at $V_{DDIX}$ (1.8V) via the turned on $M_{P42}$ and $M_{N43}$. The defined voltage $V_{PI}$ (1.8V) at the source of PMOS $M_{P22}$ protects the device from over-voltage when the output voltage $V_{PAD}$ driven to a low logic voltage $V_{SS}$ (0V) by another device.

Figure 5A:
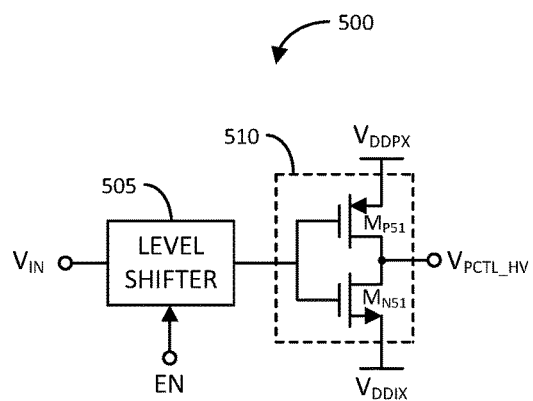
FIGS. 5A-5D illustrate schematic diagrams of exemplary first PMOS predriver, second PMOS predriver, first NMOS predriver, and second NMOS predriver in accordance with another aspect of the disclosure.

FIG. 5A illustrates a schematic diagram of an exemplary predriver 500 in accordance with another aspect of the disclosure. The predriver 500 may be an exemplary detailed implementation of the first PMOS predriver 210 previously discussed.

In summary, the predriver 500 generates the control signal $V_{PCTL\_HV}$ based on an input signal $V_{IN}$. That is, based on an enable signal EN being asserted, the predriver 500 generates the control signal $V_{PCTL\_HV}$ at a high logic voltage ($V_{DDPX}$) in a first voltage domain in response to the input signal $V_{IN}$ being at a low logic voltage in a second voltage domain. Similarly, based on the enable signal EN being asserted, the predriver 500 generates the control signal $V_{PCTL\_HV}$ at a low logic voltage ($V_{DDIX}$) in the first voltage domain in response to the input signal $V_{IN}$ being at a high logic voltage in the second voltage domain. Based on the enable signal EN not being asserted, the predriver 500 generates the control signal $V_{PCTL\_HV}$ at the high logic voltage ($V_{DDPX}$) regardless of the logic state of the input signal $V_{IN}$.

In particular, the predriver 500 includes a level shifter 505 and an inverter 510. The inverter 510, in turn, includes a first transistor (e.g., PMOS) $M_{P51}$ and a second transistor (e.g., NMOS) $M_{N51}$ coupled in series between a first voltage rail ($V_{DDPX}$) and a second voltage rail ($V_{DDIX}$). The control terminals (e.g., gates) of the PMOS $M_{P51}$ and NMOS $M_{N51}$ are coupled together, and to an output of the level shifter 505. The predriver 500 is configured to generate the control signal $V_{PCTL\_HV}$ at a node between (e.g., drains of) the PMOS $M_{P51}$ and NMOS $M_{N51}$. The level shifter 505 includes a signal input configured to receive the input signal $V_{IN}$ and a control input configured to receive the enable signal EN. As previously discussed, the level shifter 505 includes a signal output coupled to the gates of PMOS $M_{P51}$ and NMOS $M_{N51}$.

In operation, when the enable signal EN is asserted, the level shifter 505 generates an output signal to turn on PMOS $M_{P51}$ and turn off NMOS $M_{N51}$ in response to the input signal $V_{IN}$ being at a low logic voltage. This causes the control signal $V_{PCTL\_HV}$ to be substantially at the high logic voltage of $V_{DDPX}$. Also, when the enable signal EN is asserted, the level shifter 505 generates an output signal to turn off PMOS $M_{P51}$ and turn on NMOS $M_{N51}$ in response to the input signal $V_{IN}$ being at a high logic voltage. This causes the control signal $V_{PCTL\_HV}$ to be substantially at the low logic voltage of $V_{DDIX}$. When the enable signal EN is not asserted, the level shifter 505 generates an output signal to turn on PMOS $M_{P51}$ and turn off NMOS $M_{N51}$ regardless of the logic state of the input signal $V_{IN}$. This causes the control signal $V_{PCTL\_HV}$ to be maintained substantially at the high logic voltage of $V_{DDPX}$ when the enable signal EN is not asserted.

Figure 5B:
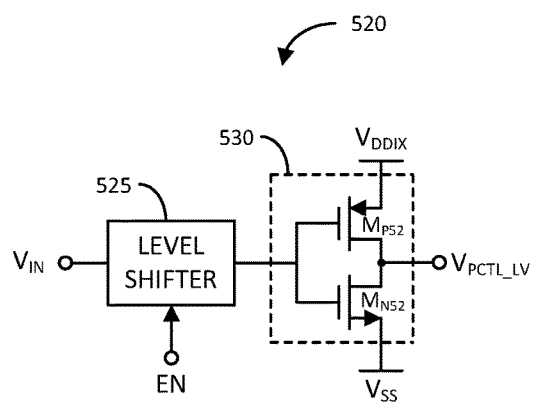

FIG. 5B illustrates a schematic diagram of another exemplary predriver 520 in accordance with another aspect of the disclosure. The predriver 520 may be an exemplary detailed implementation of the second PMOS predriver 211 previously discussed.

In summary, the predriver 520 generates the control signal $V_{PCTL\_LV}$ based on an input signal $V_{IN}$. That is, based on an enable signal EN being asserted, the predriver 520 generates the control signal $V_{PCTL\_HV}$ at a high logic voltage ($V_{DDIX}$) in a third voltage domain in response to the input signal $V_{IN}$ being at a low logic voltage in the second voltage domain. Similarly, based on the enable signal EN being asserted, the predriver 520 generates the control signal $V_{PCTL\_LV}$ at a low logic voltage ($V_{SS}$) in the third voltage domain in response to the input signal $V_{IN}$ being at a high logic voltage in the second voltage domain. Based on the enable signal EN not being asserted, the predriver 520 generates the control signal $V_{PCTL\_LV}$ at the high logic voltage ($V_{DDIX}$) regardless of the logic state of the input signal $V_{IN}$.

In particular, the predriver 520 includes a level shifter 525 and an inverter 530. The inverter 530, in turn, includes a first transistor (e.g., PMOS) $M_{P52}$ and a second transistor (e.g., NMOS) $M_{N52}$ coupled in series between a first voltage rail ($V_{DDIX}$) and a second voltage rail ($V_{SS}$). The control terminals (e.g., gates) of the PMOS $M_{P52}$ and NMOS $M_{N52}$ are coupled together, and to an output of the level shifter 525. The predriver 520 is configured to generate the control signal $V_{PCTL\_LV}$ at a node between (e.g., drains of) the PMOS $M_{P52}$ and NMOS $M_{N52}$. The level shifter 525 includes a signal input configured to receive the input signal $V_{IN}$ and a control input configured to receive the enable signal EN. As previously discussed, the level shifter 525 includes a signal output coupled to the gates of PMOS $M_{P52}$ and NMOS $M_{N52}$.

In operation, when the enable signal EN is asserted, the level shifter 525 generates an output signal to turn on PMOS $M_{P52}$ and turn off NMOS $M_{N52}$ in response to the input signal $V_{IN}$ being at a low logic voltage. This causes the control signal $V_{PCTL\_LV}$ to be substantially at the high logic voltage of $V_{DDIX}$. Also, when the enable signal EN is asserted, the level shifter 525 generates an output signal to turn off PMOS $M_{P52}$ and turn on NMOS $M_{N52}$ in response to the input signal $V_{IN}$ being at a high logic voltage. This causes the control signal $V_{PCTL\_LV}$ to be substantially at the low logic voltage of $V_{SS}$. When the enable signal EN is not asserted, the level shifter 525 generates an output signal to turn on PMOS $M_{P52}$ and turn off NMOS $M_{N52}$ regardless of the logic state of the input signal $V_{IN}$. This causes the control signal $V_{PCTL\_LV}$ to be maintained substantially at the high logic voltage of $V_{DDIX}$ when the enable signal EN is not asserted.

Figure 5C:
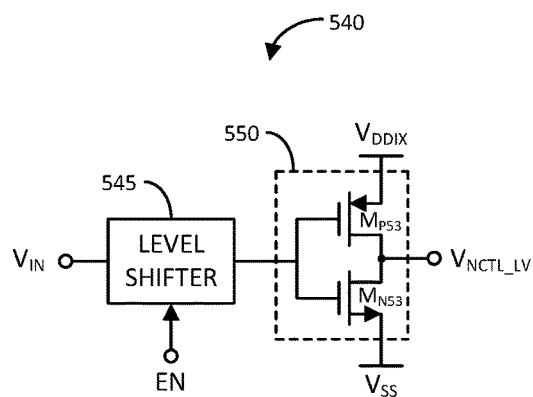

FIG. 5C illustrates a schematic diagram of another exemplary predriver 540 in accordance with another aspect of the disclosure. The predriver 540 may be an exemplary detailed implementation of the first NMOS predriver 220 previously discussed.

In summary, the predriver 540 generates the control signal $V_{NCTL\_LV}$ based on an input signal $V_{IN}$. That is, based on an enable signal EN being asserted, the predriver 540 generates the control signal $V_{NCTL\_LV}$ at a high logic voltage ($V_{DDIX}$) in the third voltage domain in response to the input signal $V_{IN}$ being at a low logic voltage in the second voltage domain. Similarly, based on the enable signal EN being asserted, the predriver 540 generates the control signal $V_{NCTL\_LV}$ at a low logic voltage ($V_{SS}$) in the third voltage domain in response to the input signal $V_{IN}$ being at a high logic voltage in the second voltage domain. Based on the enable signal EN not being asserted, the predriver 540 generates the control signal $V_{NCTL\_LV}$ at the low logic voltage ($V_{SS}$) regardless of the logic state of the input signal $V_{IN}$.

In particular, the predriver 540 includes a level shifter 545 and an inverter 550. The inverter 550, in turn, includes a first transistor (e.g., PMOS) $M_{P53}$ and a second transistor (e.g., NMOS) $M_{N53}$ coupled in series between a first voltage rail ($V_{DDIX}$) and a second voltage rail ($V_{SS}$). The control terminals (e.g., gates) of the PMOS $M_{P53}$ and NMOS $M_{N53}$ are coupled together, and to an output of the level shifter 545. The predriver 540 is configured to generate the control signal $V_{NCTL\_LV}$ at a node between (e.g., drains of) the PMOS $M_{P53}$ and NMOS $M_{N53}$. The level shifter 545 includes a signal input configured to receive the input signal $V_{IN}$ and a control input configured to receive the enable signal EN. As previously discussed, the level shifter 545 includes a signal output coupled to the gates of PMOS $M_{P53}$ and NMOS $M_{N53}$.

In operation, when the enable signal EN is asserted, the level shifter 545 generates an output signal to turn on PMOS $M_{P53}$ and turn off NMOS $M_{N53}$ in response to the input signal $V_{IN}$ being at a low logic voltage. This causes the control signal $V_{NCTL\_LV}$ to be substantially at the high logic voltage of $V_{DDIX}$. Also, when the enable signal EN is asserted, the level shifter 545 generates an output signal to turn off PMOS $M_{P53}$ and turn on NMOS $M_{N53}$ in response to the input signal $V_{IN}$ being at a high logic voltage. This causes the control signal $V_{NCTL\_LV}$ to be substantially at the low logic voltage of $V_{SS}$. When the enable signal EN is not asserted, the level shifter 545 generates an output signal to turn off PMOS $M_{P53}$ and turn on NMOS $M_{N53}$ regardless of the logic state of the input signal $V_{IN}$. This causes the control signal $V_{NCTL\_LV}$ to be maintained substantially at the low logic voltage of $V_{SS}$ when the enable signal EN is not asserted.

Figure 5D:
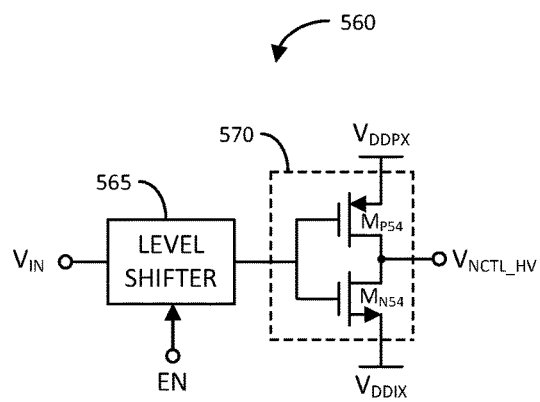

FIG. 5D illustrates a schematic diagram of an exemplary predriver 560 in accordance with another aspect of the disclosure. The predriver 560 may be an exemplary detailed implementation of the second NMOS predriver 221 previously discussed.

In summary, the predriver 560 generates the control signal $V_{NCTL\_HV}$ based on an input signal $V_{IN}$. That is, based on an enable signal EN being asserted, the predriver 560 generates the control signal $V_{NCTL\_HV}$ at a high logic voltage ($V_{DDPX}$) in the first voltage domain in response to the input signal $V_{IN}$ being at a low logic voltage in the second voltage domain. Similarly, based on the enable signal EN being asserted, the predriver 560 generates the control signal $V_{NCTL\_HV}$ at a low logic voltage ($V_{DDIX}$) in the first voltage domain in response to the input signal $V_{IN}$ being at a high logic voltage in the second voltage domain. Based on the enable signal EN not being asserted, the predriver 560 generates the control signal $V_{NCTL\_HV}$ at the low logic voltage ($V_{DDIX}$) regardless of the logic state of the input signal $V_{IN}$.

In particular, the predriver 560 includes a level shifter 565 and an inverter 570. The inverter 570, in turn, includes a first transistor (e.g., PMOS) $M_{P54}$ and a second transistor (e.g., NMOS) $M_{N54}$ coupled in series between a first voltage rail ($V_{DDPX}$) and a second voltage rail ($V_{DDIX}$). The control terminals (e.g., gates) of the PMOS $M_{P54}$ and NMOS $M_{N54}$ are coupled together, and to an output of the level shifter 565. The predriver 560 is configured to generate the control signal $V_{NCTL\_HV}$ at a node between (e.g., drains of) the PMOS $M_{P54}$ and NMOS $M_{N54}$. The level shifter 565 includes a signal input configured to receive the input signal $V_{IN}$ and a control input configured to receive the enable signal EN. As previously discussed, the level shifter 565 includes a signal output coupled to the gates of PMOS $M_{P54}$ and NMOS $M_{N54}$.

In operation, when the enable signal EN is asserted, the level shifter 565 generates an output signal to turn on PMOS $M_{P54}$ and turn off NMOS $M_{N54}$ in response to the input signal $V_{IN}$ being at a low logic voltage. This causes the control signal $V_{NCTL\_HV}$ to be substantially at the high logic voltage of $V_{DDPX}$. Also, when the enable signal EN is asserted, the level shifter 565 generates an output signal to turn off PMOS $M_{P54}$ and turn on NMOS $M_{N54}$ in response to the input signal $V_{IN}$ being at a high logic voltage. This causes the control signal $V_{NCTL\_HV}$ to be substantially at the low logic voltage of $V_{DDIX}$. When the enable signal EN is not asserted, the level shifter 565 generates an output signal to turn off PMOS $M_{P54}$ and turn on NMOS $M_{N54}$ regardless of the logic state of the input signal $V_{IN}$. This causes the control signal $V_{NCTL\_HV}$ to be maintained substantially at the low logic voltage of $V_{DDIX}$ when the enable signal EN is not asserted.

Figure 6:
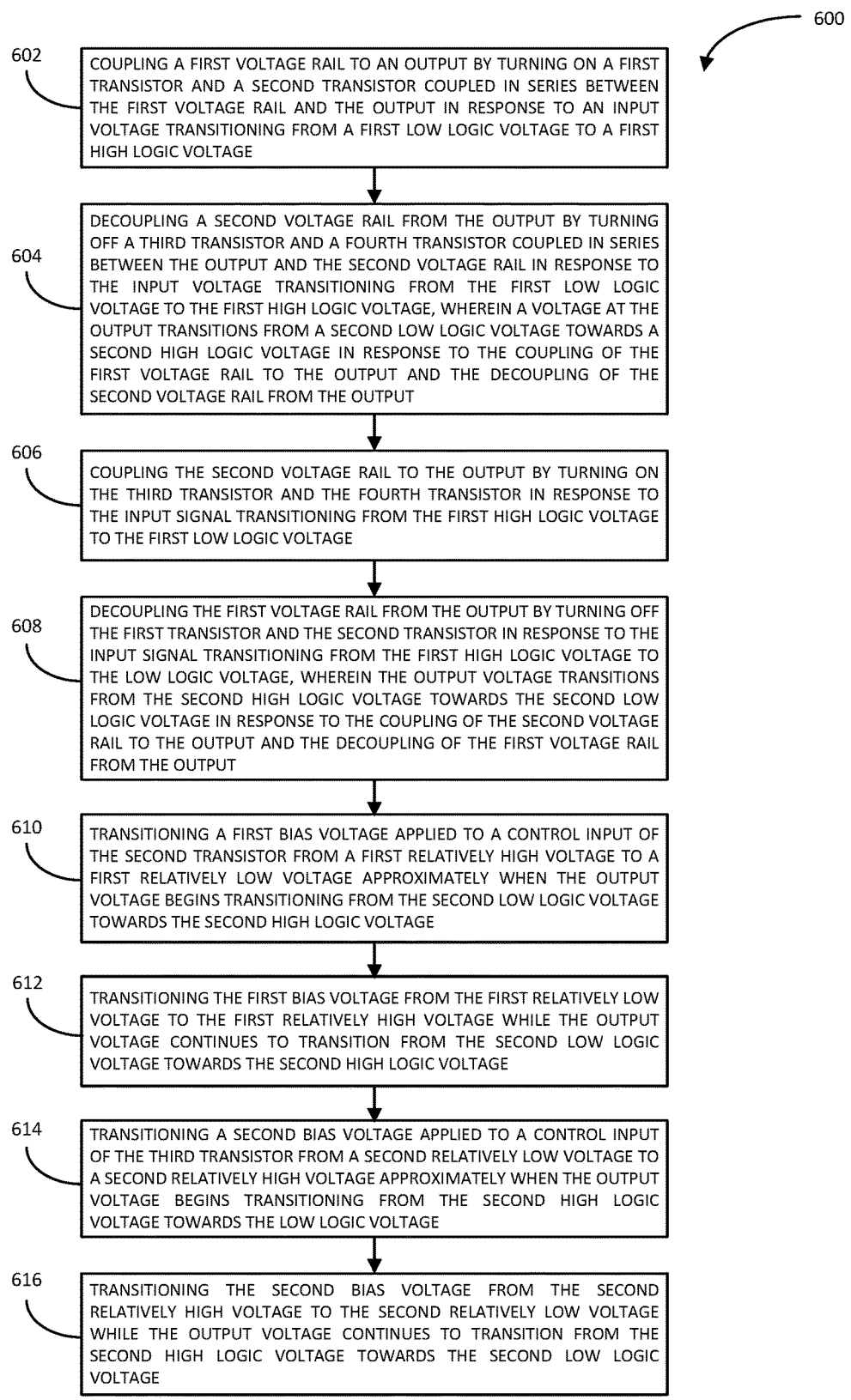
FIG. 6 illustrates a flow diagram of an exemplary method of generating an output voltage based on an input voltage in accordance with another aspect of the disclosure.

FIG. 6 illustrates a flow diagram of an exemplary method 600 of generating an output voltage based on an input voltage in accordance with another aspect of the disclosure. The method 600 includes coupling a first voltage rail to an output by turning on a first transistor and a second transistor coupled in series between the first voltage rail and the output in response to an input voltage transitioning from a first low logic voltage to a first high logic voltage (block 602). An examples of means for coupling the first voltage rail to the output include the pull-up circuit with PMOS $M_{P21}$ and $M_{P22}$ coupled in series between the voltage rail ($V_{DDPX}$) and the output ($V_{PAD}$) in I/O driver 200 depicted in FIG. 2A.

The method 600 further includes decoupling a second voltage rail from the output by turning off a third transistor and a fourth transistor coupled in series between the output and the second voltage rail in response to the input voltage transitioning from the first low logic voltage to the first high logic voltage, wherein a voltage at the output transitions from a second low logic voltage towards a second high logic voltage in response to the coupling of the first voltage rail to the output and the decoupling of the second voltage rail from the output (block 604). An example of means for decoupling a second voltage rail from the output include the pull-down circuit with NMOS $M_{N22}$ and $M_{N21}$ coupled in series between the output ($V_{PAD}$) and the voltage rail ($V_{SS}$) in I/O driver 200 depicted in FIG. 2A.

Additionally, the method 600 includes coupling the second voltage rail to the output by turning on the third transistor and the fourth transistor in response to the input signal transitioning from the first high logic voltage to the first low logic voltage (block 606). An example of means for coupling the second voltage rail to the output include the pull-down circuit with NMOS $M_{N22}$ and $M_{N21}$ coupled in series between the output ($V_{PAD}$) and the voltage rail ($V_{SS}$) in I/O driver 200 depicted in FIG. 2A.

Further, the method 600 includes decoupling the first voltage rail from the output by turning off the first transistor and the second transistor in response to the input signal transitioning from the first high logic voltage to the low logic voltage, wherein the output voltage transitions from the second high logic voltage towards the second low logic voltage in response to the coupling of the second voltage rail to the output and the decoupling of the first voltage rail from the output (block 608). An examples of means for decoupling the first voltage rail from the output include the pull-up circuit with PMOS $M_{P21}$ and $M_{P22}$ coupled in series between the voltage rail ($V_{DDPX}$) and the output ($V_{PAD}$) in I/O driver 200 depicted in FIG. 2A.

The method 600 also includes transitioning a first bias voltage applied to a control input of the second transistor from a first relatively high voltage to a first relatively low voltage approximately when the output voltage begins transitioning from the second low logic voltage towards the second high logic voltage (block 610). Examples of such means for transitioning a first bias voltage include the $V_{PBIAS}$ voltage generators 212 and 320 depicted in FIGS. 2A and 3A, respectively.

The method 600 further includes transitioning the first bias voltage from the first relatively low voltage to the first relatively high voltage while the output voltage continues to transition from the second low logic voltage towards the second high logic voltage (block 612). Examples of such means for transitioning the first bias voltage include the $V_{PBIAS}$ voltage generators 212 and 320 depicted in FIGS. 2A and 3A, respectively.

In addition, the method 600 includes transitioning a second bias voltage applied to a control input of the third transistor from a second relatively low voltage to a second relatively high voltage approximately when the output voltage begins transitioning from the second high logic voltage towards the low logic voltage (block 614). Examples of such means for transitioning a second bias voltage include the $V_{NBIAS}$ voltage generators 222 and 310 depicted in FIGS. 2A and 3A, respectively.

The method 600 also includes transitioning the second bias voltage from the second relatively high voltage to the second relatively low voltage while the output voltage continues to transition from the second high logic voltage towards the second low logic voltage (block 616). Examples of such means for transitioning the second bias voltage include the $V_{NBIAS}$ voltage generators 222 and 310 depicted in FIGS. 2A and 3A, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a pull-up circuit including a first transistor and a second transistor coupled in series between a first voltage rail and an output;
   a pull-down circuit including a third transistor and a fourth transistor coupled in series between the output and a second voltage rail;
   a first voltage generator configured to generate a first bias voltage responsive to a voltage at the output, wherein a control input of the second transistor is configured to receive the first bias voltage, the first bias voltage configured to transition from a first relatively high voltage to a first relatively low voltage approximately when the voltage at the output begins transitioning from a first low logic voltage towards a first high logic voltage due to the pull-up circuit coupling the first voltage rail to the output and the pull-down circuit decoupling the output from the second voltage rail, and the first bias voltage also configured to transition from the first relatively low voltage to the first relatively high voltage while the output voltage continues to transition from the first low logic voltage towards the first high logic voltage; and
   a second voltage generator configured to generate a second bias voltage responsive to the voltage at the output, wherein a control input of the third transistor is configured to receive the second bias voltage, the second bias voltage configured to transition from a second relatively low voltage to a second relatively high voltage approximately when the output voltage begins transitioning from the first high logic voltage towards the first low logic voltage due to the pull-down circuit coupling the output to the second voltage rail and the pull-up circuit decoupling the first voltage rail from the output, and the second bias voltage also configured to transition from the second relatively high voltage to the second relatively low voltage while the output voltage continues to transition from the first high logic voltage towards the first low logic voltage.

2. The apparatus of claim 1, wherein a time interval beginning with the first bias voltage transitioning from the first relatively high voltage to the first relatively low voltage and ending with the first bias voltage transitioning from the first relatively low voltage to the first relatively high voltage is a function of a rate at which the output voltage transitions from the first low logic voltage towards the first high logic voltage.

3. The apparatus of claim 1, wherein a time interval beginning with the second bias voltage transitioning from the second relatively low voltage to the second relatively high voltage and ending with the second bias voltage transitioning from the second relatively high voltage to the second relatively low voltage is a function of a rate at which the output voltage transitions from the first high logic voltage towards the first low logic voltage.

4. The apparatus of claim 1, wherein the first bias voltage is configured to transition from the first relatively low voltage to the first relatively high voltage in response to the output voltage increasing to a defined voltage level.

5. The apparatus of claim 1, wherein the second bias voltage is configured to transition from the second relatively high voltage to the second relatively low voltage in response to the output voltage decreasing to a defined voltage level.

6. The apparatus of claim 1, further comprising a pre-driver configured to generate a third voltage, the third voltage configured to transition from a second high logic voltage to a second low logic voltage in response to an input voltage transitioning from a third low logic voltage to a third high logic voltage, wherein the first bias voltage is configured to transition from the first relatively high voltage to the first relatively low voltage in response to the third voltage transitioning from the second high logic voltage to the second low logic voltage.

7. The apparatus of claim 1, further comprising a pre-driver configured to generate a third voltage, the third voltage configured to transition from a second low logic voltage to a second high logic voltage in response to an input voltage transitioning from a third high logic voltage to a third low logic voltage, wherein the second bias voltage is configured to transition from the second relatively low voltage to the second relatively high voltage in response to the third voltage transitioning from the second low logic voltage to the second low logic voltage.

8. The apparatus of claim 1, wherein the first relatively high voltage is different than the second relatively high voltage, and wherein the first relatively low voltage is different than the second relatively low voltage.

9. The apparatus of claim 1, further comprising a third voltage generator configured to generate a third voltage applied to a node between the first transistor and the second transistor in response to the output voltage transitioning to or being at the first low logic voltage, wherein the third voltage is substantially halfway between the first high logic voltage and the first low logic voltage.

10. The apparatus of claim 1, further comprising a third voltage generator configured to generate a third voltage applied to a node between the third transistor and the fourth transistor in response to the output voltage transitioning to or being at the first high logic voltage, wherein the third voltage is substantially halfway between the first high logic voltage and the first low logic voltage.

11. A method, comprising:
    coupling a first voltage rail to an output by turning on a first transistor and a second transistor coupled in series between the first voltage rail and the output in response to an input voltage transitioning from a first low logic voltage to a first high logic voltage;
    decoupling a second voltage rail from the output by turning off a third transistor and a fourth transistor coupled in series between the output and the second voltage rail in response to the input voltage transitioning from the first low logic voltage to the first high logic voltage, wherein a voltage at the output transitions from a second low logic voltage towards a second high logic voltage in response to the coupling of the first voltage rail to the output and the decoupling of the second voltage rail from the output;

coupling the second voltage rail to the output by turning on the third transistor and the fourth transistor in response to the input signal transitioning from the first high logic voltage to the first low logic voltage;

decoupling the first voltage rail from the output by turning off the first transistor and the second transistor in response to the input signal transitioning from the first high logic voltage to the low logic voltage, wherein the output voltage transitions from the second high logic voltage towards the second low logic voltage in response to the coupling of the second voltage rail to the output and the decoupling of the first voltage rail from the output;

transitioning a first bias voltage applied to a control input of the second transistor from a first relatively high voltage to a first relatively low voltage approximately when the output voltage begins transitioning from the second low logic voltage towards the second high logic voltage;

transitioning the first bias voltage, responsive to the voltage at the output, from the first relatively low voltage to the first relatively high voltage while the output voltage continues to transition from the second low logic voltage towards the second high logic voltage;

transitioning a second bias voltage applied to a control input of the third transistor from a second relatively low voltage to a second relatively high voltage approximately when the output voltage begins transitioning from the second high logic voltage towards the low logic voltage; and transitioning the second bias voltage, responsive to the voltage at the output, from the second relatively high voltage to the second relatively low voltage while the output voltage continues to transition from the second high logic voltage towards the second low logic voltage.

12. The method of claim 11, wherein a time interval beginning with the first bias voltage transitioning from the first relatively high voltage to the first relatively low voltage and ending with the first bias voltage transitioning from the first relatively low voltage to the first relatively high voltage is a function of a rate at which the output voltage transitions from the second low logic voltage towards the second high logic voltage.

13. The method of claim 11, wherein a time interval beginning with the second bias voltage transitioning from the second relatively low voltage to the second relatively high voltage and ending with the second bias voltage transitioning from the second relatively high voltage to the second relatively low voltage is a function of a rate at which the output voltage transitions from the second high logic voltage towards the second low logic voltage.

14. The method of claim 11, wherein the first bias voltage is configured to transition from the first relatively low voltage to the first relatively high voltage in response to the output voltage increasing to a defined voltage level.

15. The method of claim 11, wherein the second bias voltage is configured to transition from the second relatively high voltage to the second relatively low voltage in response to the output voltage decreasing to a defined voltage level.

16. The method of claim 11, further comprising transitioning a third voltage from a third high logic voltage to a third low logic voltage in response to the input voltage transitioning from the first low logic voltage to the first high logic voltage, wherein the first bias voltage is configured to transition from the first relatively high voltage to the first relatively low voltage in response to the third voltage transitioning from the third high logic voltage to the third low logic voltage.

17. The method of claim 11, further comprising transitioning a third voltage from a third low logic voltage to a third high logic voltage in response to the input voltage transitioning from the first high logic voltage to the first low logic voltage, wherein the second bias voltage is configured to transition from the second relatively low voltage to the second relatively high voltage in response to the third voltage transitioning from the third high logic voltage to the third low logic voltage.

18. The method of claim 11, wherein the first relatively high voltage is different than the second relatively high voltage, and wherein the first relatively low voltage is different than the second relatively low voltage.

19. The method of claim 11, further comprising generating a third voltage applied to a node between the first transistor and the second transistor in response to the output voltage transitioning to or being at the second low logic voltage, wherein the third voltage is substantially halfway between the second high logic voltage and the second low logic voltage.

20. The method of claim 11, further comprising generating a third voltage applied to a node between the third transistor and the fourth transistor in response to the output voltage transitioning to or being at the second high logic voltage, wherein the third voltage is substantially halfway between the second high logic voltage and the second low logic voltage.

21. An apparatus, comprising:

means for coupling a first voltage rail to an output by turning on a first transistor and a second transistor coupled in series between the first voltage rail and the output in response to an input voltage transitioning from a first low logic voltage to a first high logic voltage;

means for decoupling a second voltage rail from the output by turning off a third transistor and a fourth transistor coupled in series between the output and the second voltage rail in response to the input voltage transitioning from the first low logic voltage to the first high logic voltage, wherein a voltage at the output transitions from a second low logic voltage towards a second high logic voltage in response to the coupling of the first voltage rail to the output and the decoupling of the second voltage rail from the output;

means for coupling the second voltage rail to the output by turning on the third transistor and the fourth transistor in response to the input signal transitioning from the first high logic voltage to the first low logic voltage;

means for decoupling the first voltage rail from the output by turning off the first transistor and the second transistor in response to the input signal transitioning from the first high logic voltage to the first low logic voltage, wherein the output voltage transitions from the second high logic voltage towards the second low logic voltage in response to the coupling of the second voltage rail to the output and the decoupling of the first voltage rail from the output;

means for transitioning a first bias voltage applied to a control input of the second transistor from a first relatively high voltage to a first relatively low voltage approximately when the output voltage begins transitioning from the second low logic voltage towards the second high logic voltage;

means for transitioning the first bias voltage, responsive to the voltage at the output, from the first relatively low voltage to the first relatively high voltage while the output voltage continues to transition from the second low logic voltage towards the second high logic voltage;

means for transitioning a second bias voltage applied to a control input of the third transistor from a second relatively low voltage to a second relatively high voltage approximately when the output voltage begins transitioning from the second high logic voltage to the second low logic voltage; and means for transitioning the second bias voltage, responsive to the voltage at the output, from the second relatively high voltage to the second relatively low voltage while the output voltage continues to transition from the second high logic voltage towards the second low logic voltage.

22. The apparatus of claim 21, wherein a time interval beginning with the first bias voltage transitioning from the first relatively high voltage to the first relatively low voltage and ending with the first bias voltage transitioning from the first relatively low voltage to the first relatively high voltage is a function of a rate at which the output voltage transitions from the second low logic voltage towards the second high logic voltage.

23. The apparatus of claim 21, wherein a time interval beginning with the second bias voltage transitioning from the second relatively low voltage to the second relatively high voltage and ending with the second bias voltage transitioning from the second relatively high voltage to the second relatively low voltage is a function of a rate at which the output voltage transitions from the second high logic voltage towards the second low logic voltage.

24. The apparatus of claim 21, wherein the first bias voltage is configured to transition from the first relatively low voltage to the first relatively high voltage in response to the output voltage increasing to a defined voltage level.

25. The apparatus of claim 21, wherein the second bias voltage is configured to transition from the second relatively high voltage to the second relatively low voltage in response to the output voltage decreasing to a defined voltage level.

26. The apparatus of claim 21, further comprising means for transitioning a third voltage from a third high logic voltage to a third low logic voltage in response to the input voltage transitioning from the first low logic voltage to the first high logic voltage, wherein the first bias voltage is configured to transition from the first relatively high voltage to the first relatively low voltage in response to the third voltage transitioning from the third high logic voltage to the third low logic voltage.

27. The apparatus of claim 21, further comprising means for transitioning a third voltage from a third low logic voltage to a third high logic voltage in response to the input voltage transitioning from the first high logic voltage to the first low logic voltage, wherein the second bias voltage is configured to transition from the second relatively low voltage to the second relatively high voltage in response to the third voltage transitioning from the third high logic voltage to the third low logic voltage.

28. The apparatus of claim 21, wherein the first relatively high voltage is different than the second relatively high voltage, and wherein the first relatively low voltage is different than the second relatively low voltage.

29. The apparatus of claim 21, further comprising means for generating a third voltage applied to a node between the first transistor and the second transistor in response to the output voltage transitioning to or being at the second low logic voltage, wherein the third voltage is substantially halfway between the second high logic voltage and the second low logic voltage.

30. The apparatus of claim 21, further comprising means for generating a third voltage applied to a node between the third transistor and the fourth transistor in response to the output voltage transitioning to or being at the second high logic voltage, wherein the third voltage is substantially halfway between the second high logic voltage and the second low logic voltage.

* * * * *